(12) United States Patent
Hyung et al.

(10) Patent No.: US 11,133,364 B2
(45) Date of Patent: Sep. 28, 2021

(54) LIGHT EMITTING DIODE DISPLAY DEVICE

(71) Applicant: Samsung Display Co., LTD., Yongin-si (KR)

(72) Inventors: Jun-Woo Hyung, Seongnam-si (KR); Young-Cheol Jeong, Hwaseong-si (KR); Seung-Hoon Lee, Hwaseong-si (KR); Young-Ran Son, Seoul (KR); Jee-Hyun Lee, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 2 days.

(21) Appl. No.: 16/681,488

(22) Filed: Nov. 12, 2019

(65) Prior Publication Data

US 2020/0203456 A1 Jun. 25, 2020

(30) Foreign Application Priority Data

Dec. 21, 2018 (KR) .................. 10-2018-0167472

(51) Int. Cl.
| | |
|---|---|
| *H01L 27/32* | (2006.01) |
| *H01L 27/12* | (2006.01) |
| *H01L 29/786* | (2006.01) |
| *H01L 29/66* | (2006.01) |
| *G09G 3/3233* | (2016.01) |

(52) U.S. Cl.
CPC ...... *H01L 27/3262* (2013.01); *H01L 27/3265* (2013.01); *H01L 27/3276* (2013.01); *G09G 3/3233* (2013.01); *G09G 2300/0819* (2013.01); *G09G 2320/0257* (2013.01); *H01L 27/1214* (2013.01); *H01L 2227/323* (2013.01)

(58) Field of Classification Search
CPC ....................... H01L 27/3262; H01L 27/3265; H01L 27/124
See application file for complete search history.

(56) References Cited

U.S. PATENT DOCUMENTS

| | | | |
|---|---|---|---|
| 2012/0273773 A1* | 11/2012 | Ieda | H01L 29/24 257/43 |
| 2014/0077180 A1* | 3/2014 | Moon | G09G 3/3225 257/40 |

FOREIGN PATENT DOCUMENTS

| | | |
|---|---|---|
| KR | 1020130115657 | 10/2013 |
| KR | 1020150060015 | 6/2015 |
| KR | 1020150075687 | 7/2015 |
| KR | 1020170026009 | 3/2017 |

* cited by examiner

*Primary Examiner* — Herve-Louis Y Assouman
(74) *Attorney, Agent, or Firm* — Cantor Colburn LLP

(57) ABSTRACT

A light emitting diode display device includes a substrate, a first layer disposed on the substrate, a first transistor disposed on the first layer and including a first gate electrode, and a light emitting diode connected to the first transistor, wherein the first layer may overlap the first gate electrode, and may include a first region including a first material and a second region including a second material different from the first material, the first material may include amorphous silicon doped with impurities, and the second material may include amorphous silicon.

20 Claims, 21 Drawing Sheets

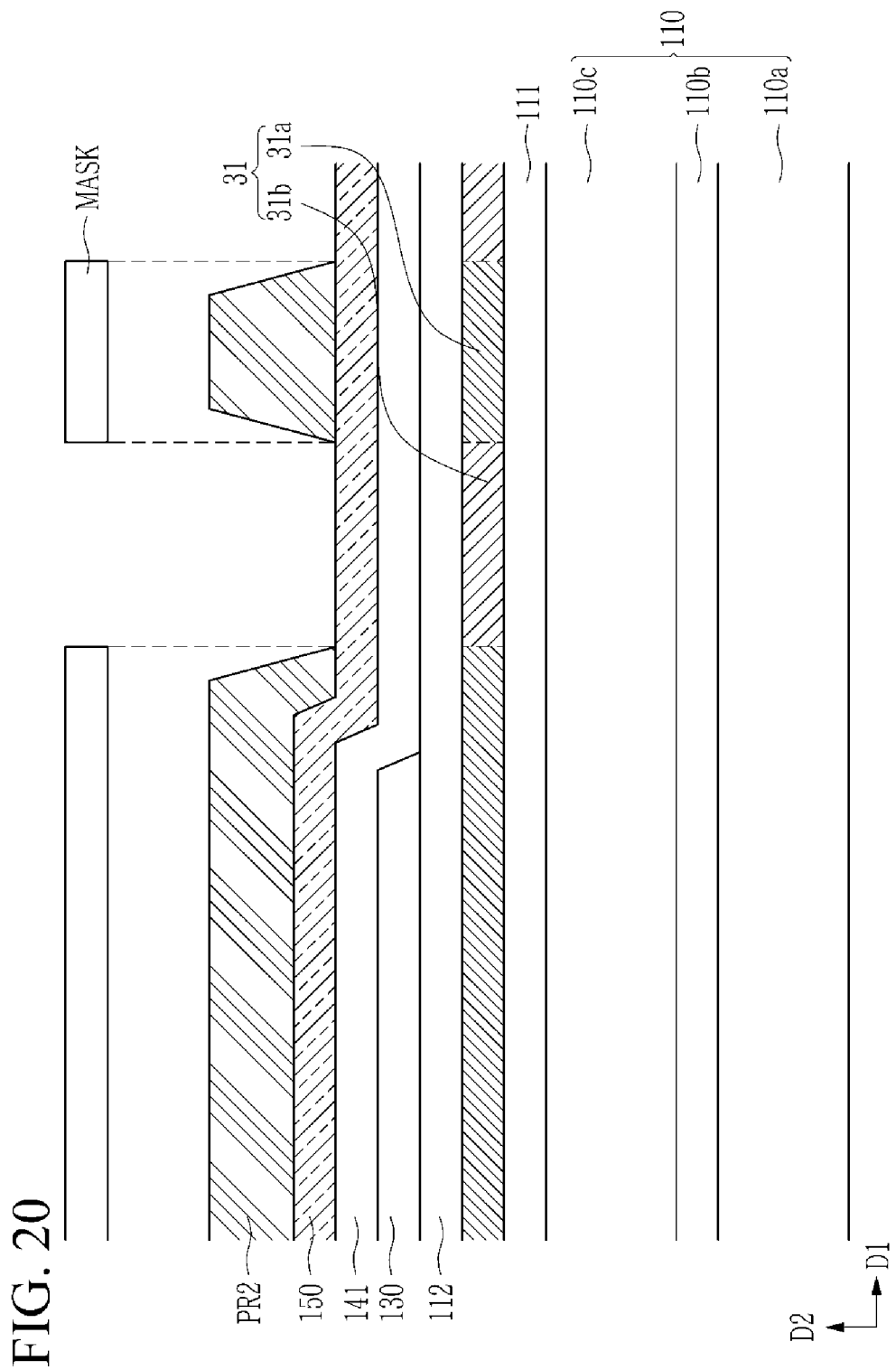

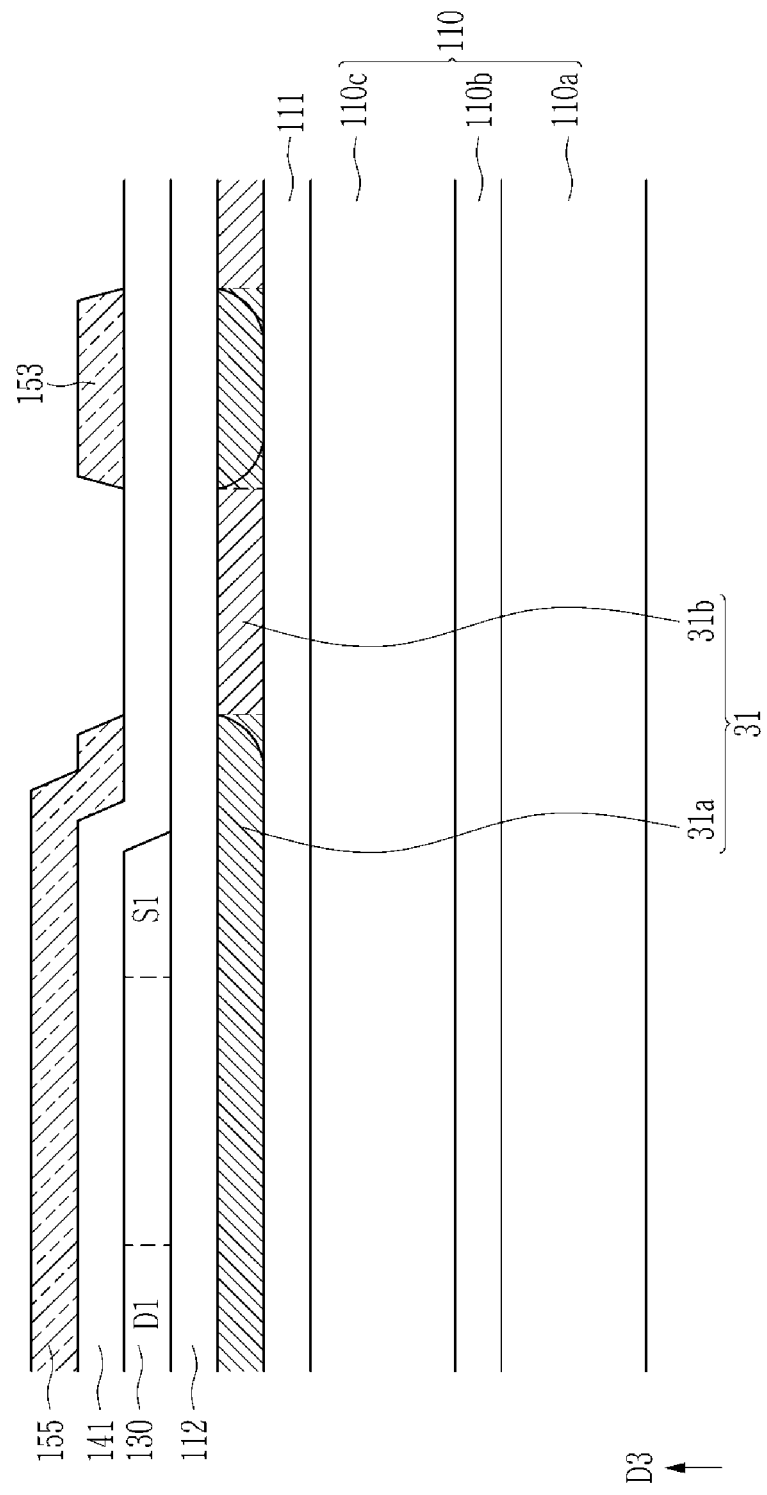

LIGHT EMITTING DIODE DISPLAY DEVICE

This application claims priority to Korean Patent Application No. 10-2018-0167472 filed on Dec. 21, 2018, and all the benefits accruing therefrom under 35 U.S.C. § 119, the content of which in its entirety is herein incorporated by reference.

BACKGROUND

(a) Field

Exemplary embodiments of the invention relate to a light emitting diode display device.

(b) Description of the Related Art

Recently, a light emitting diode display device has attracted attention as a device for displaying an image.

Since the light emitting diode display device has a self-emission characteristic and does not desire an additional light source, unlike a liquid crystal display device, it is possible to reduce thickness and weight thereof. Further, the light emitting diode display device has high-quality characteristics such as low power consumption, high luminance, and high response speed.

Generally, the light emitting diode display device includes a substrate, a plurality of transistors disposed on the substrate, a plurality of insulating films disposed between wires included in the transistors, and a light emitting diode connected to the transistors.

SUMMARY

Exemplary embodiments of the invention provide a light emitting diode display device that may be manufactured by a simple manufacturing process, have excellent transistor performance, and improve an afterimage.

An exemplary embodiment of the invention provides a light emitting diode display device including a substrate, a first layer disposed on the substrate, a first transistor disposed on the first layer and including a first gate electrode, and a light emitting diode connected to the first transistor, where the first layer may overlap the first gate electrode, and may include a first region including a first material and a second region including a second material different from the first material, the first material may include amorphous silicon doped with impurities, and the second material may include amorphous silicon.

In an exemplary embodiment, the first region may have conductivity.

In an exemplary embodiment, the light emitting diode display device may include a second gate conductor disposed on the first layer, and the first gate conductor may include a second scan line, a first scan line, a light emitting control line, and the first gate electrode.

In an exemplary embodiment, the first region may have substantially a same planar shape as that of the first gate conductor.

In an exemplary embodiment, the first region may include at least one of a first sub-region overlapping the second scan line, a second sub-region overlapping the first scan line, a third sub-region overlapping the first gate electrode, and a fourth sub-region overlapping the light emitting control line.

In an exemplary embodiment, the first sub-region, the second sub-region, and the fourth sub-region may extend along a first direction.

In an exemplary embodiment, the light emitting diode display device may include a second gate conductor disposed on the first layer, and the second gate conductor may include a parasitic capacitor control pattern, a storage line, and an initializing voltage line.

In an exemplary embodiment, the first region may have substantially a same planar shape as that of the second gate conductor.

In an exemplary embodiment, the first region may include at least one of a first sub-region overlapping the initializing voltage line, a second sub-region overlapping the parasitic capacitor control pattern, and a third sub-region overlapping the storage line.

In an exemplary embodiment, the first sub-region and the third sub-region may extend along the first direction.

In an exemplary embodiment, the first region may overlap the first transistor.

In an exemplary embodiment, the first region may receive a predetermined voltage.

In an exemplary embodiment, a driving voltage may be applied to the first region.

In an exemplary embodiment, a thickness of the first region may be reduced toward an end of the first region.

In an exemplary embodiment, a thickness of the first region may be smaller than that of the first layer.

In an exemplary embodiment, a thickness of the first region may be equal to a thickness of the first layer.

Another exemplary embodiment of the invention provides a light emitting diode display device including a substrate, a first layer disposed on the substrate, a first transistor disposed on the first layer, and a light emitting diode connected to the first transistor, where the first layer may include a first region overlapping the first transistor and having conductivity, and a second region surrounding the first region and including a semiconductor material.

In an exemplary embodiment, the substrate may include a display area in which the light emitting device is disposed and a peripheral area surrounding the display area, and the first region may receive a constant voltage in the peripheral area.

In the exemplary embodiments, it is possible to form a first region including amorphous silicon doped with an impurity by a mask that forms a gate conductor. In the exemplary embodiments, it is unnecessary to manufacture a separate mask for forming a first region, so that a process therefor may be simplified and a cost desired for the process may be reduced. In addition, in the exemplary embodiments, since a first region may be formed only at a necessary position, it is possible to provide a light emitting diode display device that is excellent in an afterimage improving effect without affecting other transistors.

BRIEF DESCRIPTION OF THE DRAWINGS

The above and other exemplary embodiments, advantages and features of this disclosure will become more apparent by describing in further detail exemplary embodiments thereof with reference to the accompanying drawings, in which:

FIGS. 16, 17, 18, 19, 20, and 21 illustrate a cross-sectional view of a light emitting diode display device according to a manufacturing process, respectively.

DETAILED DESCRIPTION

Figure 1:
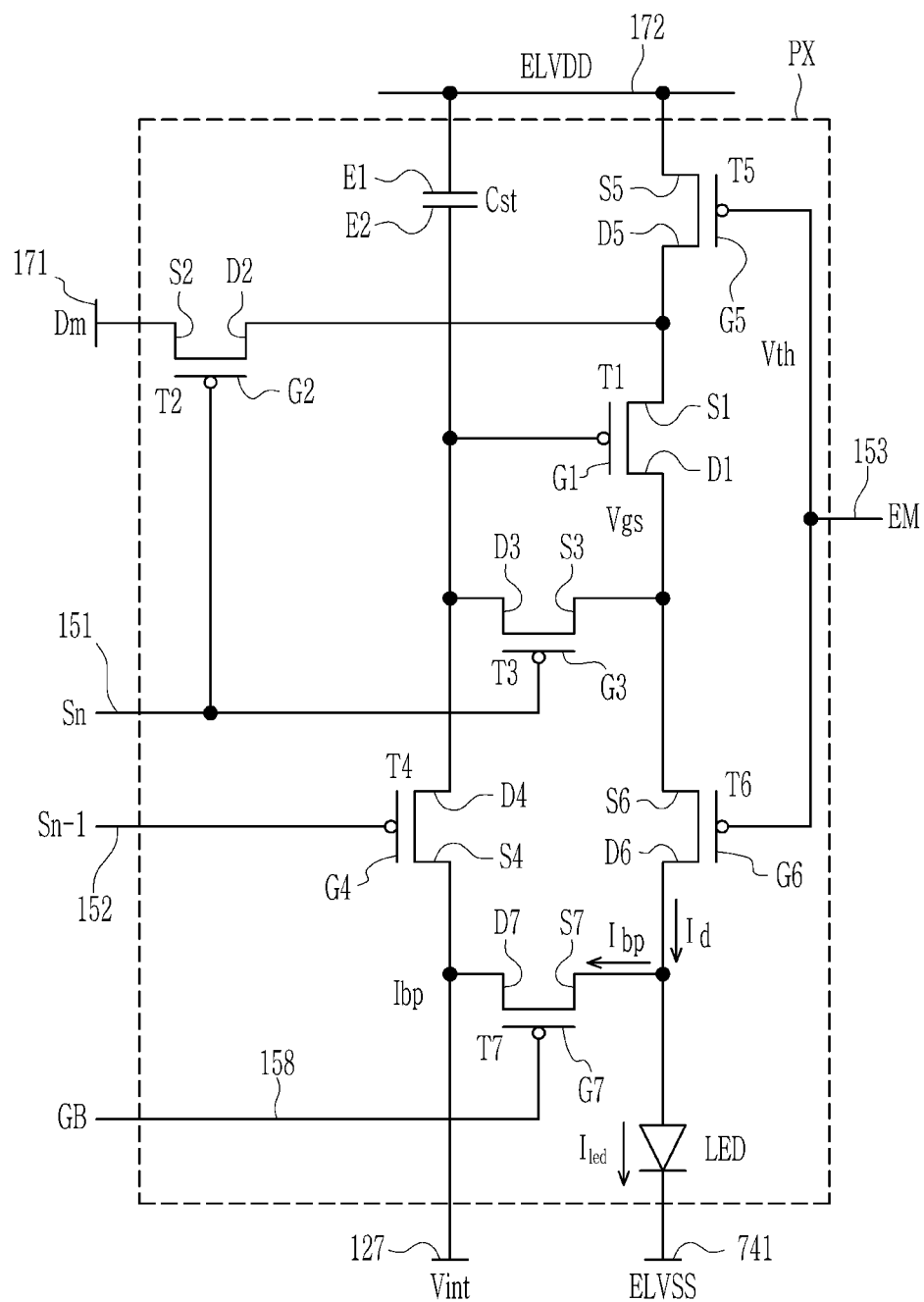
FIG. 1 illustrates an exemplary embodiment of an equivalent circuit diagram of one pixel of a light emitting diode display device.

The invention will be described more fully hereinafter with reference to the accompanying drawings, in which exemplary embodiments of the invention are shown. As those skilled in the art would realize, the described embodiments may be modified in various different ways, all without departing from the spirit or scope of the invention.

To clearly describe the invention, portions which do not relate to the description are omitted, and like reference numerals designate like elements throughout the specification.

Further, in the drawings, the size and thickness of each element are arbitrarily illustrated for ease of description, and the invention is not necessarily limited to those illustrated in the drawings. In the drawings, the thicknesses of layers, films, panels, regions, etc., are exaggerated for clarity. In the drawings, for ease of description, the thicknesses of some layers and areas are exaggerated.

It will be understood that when an element such as a layer, film, region, or substrate is referred to as being "on" another element, it may be directly on the other element or intervening elements may also be present. In contrast, when an element is referred to as being "directly on" another element, there are no intervening elements present. Further, in the specification, the word "on" or "above" means positioned on or below the object portion, and does not necessarily mean positioned on the upper side of the object portion based on a gravitational direction.

In addition, unless explicitly described to the contrary, the word "comprise" and variations such as "comprises" or "comprising" will be understood to imply the inclusion of stated elements but not the exclusion of any other elements. Further, throughout the specification, the phrase "in a plan view" means viewing a target portion from the top, and the phrase "in a cross-section" means viewing a cross-section formed by vertically cutting a target portion from the side.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Figure 2:
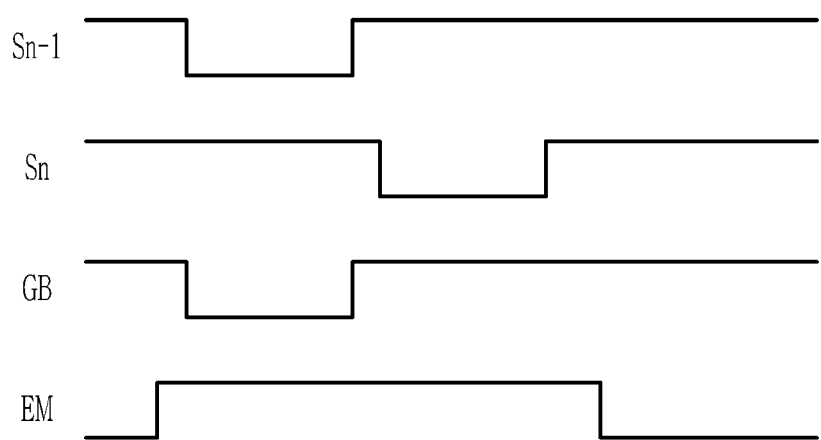
FIG. 2 illustrates an exemplary embodiment of a timing chart of a signal applied to one pixel of a light emitting diode display device.

Hereinafter, an exemplary embodiment of a light emitting diode display device will be described with reference to FIGS. 1 and 2. FIG. 1 illustrates an equivalent circuit diagram of an exemplary embodiment of one pixel of a light emitting diode display device, and FIG. 2 illustrates a timing chart of an exemplary embodiment of a signal applied to one pixel of a light emitting diode display device.

Referring to FIG. 1, a pixel PX of a light emitting diode display device includes a plurality of transistors T1, T2, T3, T4, T5, T6, and T7 connected to a plurality of signal lines 127, 151, 152, 153, 158, 171, 172, and 741, a storage capacitor Cst, and a light emitting diode LED.

In an exemplary embodiment, a first layer may be disposed on a front surface of the pixel PX shown in FIG. 1. The first layer includes a first region and a second region, and the first region may overlap a position at which a first transistor T1 is disposed. The first layer will be described in detail below with reference to FIGS. 3 to 5.

The light emitting diode display device includes a display area in which an image is displayed, and the pixels PX are arranged in various shapes in the display area.

The plurality of transistors T1, T2, T3, T4, T5, T6, and T7 include a driving transistor T1, switching transistors connected to a first scan line 151, that is, a second transistor T2 and a third transistor T3, and the other transistors are transistors (hereinafter also referred to as compensating transistors) for performing operations desired to drive the light emitting diodes LED. The compensating transistors T4, T5, T6, and T7 may include a fourth transistor T4, a fifth transistor T5, a sixth transistor T6, and a seventh transistor T7.

The plurality of signal lines 127, 151, 152, 153, 158, 171, 172, and 741 may include the first scan line 151, a second scan line 152, a light emitting control line 153, a bypass control line 158, a data line 171, a driving voltage line 172, an initializing voltage line 127, and a common voltage line 741. The bypass control line 158 may be a part of the second scan line 152 or may be electrically connected thereto.

The first scan line 151 is connected to a gate driver to transmit a scan signal Sn to the second transistor T2 and the third transistor T3. The second scan line 152 is connected to the gate driver, and transmits a front scan signal Sn-1 applied to the pixel PX disposed at a previous stage to the fourth transistor T4. The light emitting control line 153 is connected to a light emitting control portion, and transmits a light emitting control signal EM for controlling a light emitting time of the light emitting diode LED to the fifth transistor T5 and the sixth transistor T6. The bypass control line 158 transmits a bypass signal GB to the seventh transistor T7.

The data line 171 is a wire for transmitting a data voltage Dm generated in a data driver, and luminance at which the light emitting diode LED (also referred to as the light emitting element) emits varies in accordance with the data voltage Dm. The driving voltage line 172 applies a driving voltage ELVDD. The initializing voltage line 127 transmits an initialization voltage Vint for initializing the driving transistor T1. The common voltage line 741 applies a common voltage ELVSS. Voltages applied to the driving voltage line 172, the initializing voltage line 127, and the common voltage line 741 may be constant.

Hereinafter, a plurality of transistors will be described.

The driving transistor T1 is a transistor that adjusts a current outputted according to the applied data voltage Dm. An outputted driving current Id is applied to the light emitting diode LED to adjust brightness of the light emitting diode LED according to the data voltage Dm. To this end, a first electrode S1 of the driving transistor T1 is disposed to receive the driving voltage ELVDD. The first electrode S1 is connected to the driving voltage line 172 via the fifth transistor T5. In addition, the first electrode S1 of the driving transistor T1 is connected to a second electrode D2 of the second transistor T2 to receive the data voltage Dm. A second electrode D1 (output electrode) of the driving transistor T1 is disposed to be able to output a current to the light emitting diode LED. The second electrode D1 of the driving transistor T1 is connected to an anode of the light emitting diode LED via the sixth transistor T6. A gate electrode G1 thereof is connected to one electrode (second storage electrode E2) of the storage capacitor Cst. Accordingly, a voltage of the gate electrode G1 varies depending on a voltage stored in the storage capacitor Cst, thus the driving current Id outputted by the driving transistor T1 varies.

The second transistor T2 is a transistor for receiving the data voltage Dm into the pixel PX. A gate electrode G2 is connected to the first scan line 151, and the first electrode S2 is connected to the data line 171. A second electrode D2 of the second transistor T2 is connected to the first electrode S1 of the driving transistor T1. When the second transistor T2 is turned on depending on the first scan signal Sn transmitted through the first scan line 151, the data voltage Dm transmitted through the data line 171 is transmitted to the first electrode S1 of the driving transistor T1.

The third transistor T3 is a transistor that allows a compensation voltage (a voltage of Dm+Vth) in which the data voltage Dm is changed while passing through the driving transistor T1 to be transmitted to a second storage electrode E2 of the storage capacitor Cst. A gate electrode G3 thereof is connected to the first scan line 151, and a first electrode S3 thereof is connected to the second electrode D1 of the driving transistor T1. A second electrode D3 of the third transistor T3 is connected to the second storage electrode E2 of the storage capacitor Cst and the gate electrode G1 of the driving transistor T1. The third transistor T3 connects the gate electrode G1 and the second electrode D1 of the driving transistor T1 depending on the scan signal Sn received through the first scan line 151, and it also connects the second electrode D1 of the driving transistor T1 and the second storage electrode E2 of the storage capacitor Cst.

The fourth transistor T4 serves to initialize the gate electrode G1 of the driving transistor T1 and the second storage electrode E2 of the storage capacitor Cst. A gate electrode G4 is connected to the second scan line 152, and a first electrode S4 is connected to the initializing voltage line 127. A second electrode D4 of the fourth transistor T4 is connected to the second storage electrode E2 of the storage capacitor Cst and the gate electrode G1 of the driving transistor T1 via the second electrode D3 of the third transistor T3. The fourth transistor T4 transmits the initialization voltage Vint to the gate electrode G1 of the driving transistor T1 and the second storage electrode E2 of the storage capacitor Cst depending on the front scan signal Sn-1 received through the second scan line 152. Thus, a gate voltage of the gate electrode G1 of the driving transistor T1 and the storage capacitor Cst are initialized. The initialization voltage Vint has a low voltage value, thus it may be a voltage capable of turning on the driving transistor T1.

The fifth transistor T5 serves to transmit the driving voltage ELVDD to the driving transistor T1. A gate electrode G5 is connected to the light emitting control line 153, and a first electrode S5 is connected to the driving voltage line 172. A second electrode D5 of the fifth transistor T5 is connected to the first electrode S1 of the driving transistor T1.

The sixth transistor T6 serves to transmit the driving current Id outputted from the driving transistor T1 to the light emitting diode LED. A gate electrode G6 is connected to the light emitting control line 153, and a first electrode S6 is connected to the second electrode D1 of the driving transistor T1. A second electrode D6 of the sixth transistor T6 is connected to the anode of the light emitting diode LED.

The fifth transistor T5 and the sixth transistor T6 are simultaneously turned on by the light emitting control signal EM received through the light emitting control line 153, and when the driving voltage ELVDD is applied to the first electrode S1 of the driving transistor T1 through the fifth transistor T5, the driving transistor T1 outputs the driving current Id according to a voltage (i.e., a voltage of the second storage electrode E2 of the storage capacitor Cst) of the gate electrode G1 of the driving transistor T1. The outputted driving current Id is transmitted to the light emitting diode LED through the sixth transistor T6. The light emitting diode LED emits light as a current Ilea flows therethrough.

The seventh transistor T7 serves to initialize the anode of the light emitting diode LED. A gate electrode G7 is connected to the bypass control line 158, a first electrode S7 is connected to the anode of the light emitting diode LED, and a second electrode D7 is connected to the initializing voltage line 127. In an exemplary embodiment, the bypass control line 158 may be connected to the second scan line 152, and the bypass signal GB may be the same timing signal as the front scan signal Sn-1. In an exemplary embodiment, the bypass control line 158 is not connected to the second scan line 152, and may transmit a separate signal that is different from the front scan signal Sn-1. When the seventh transistor T7 is turned on by the bypass signal GB, the initialization voltage Vint is applied to the anode of the light emitting diode LED to initialize it.

A first storage electrode E1 of the storage capacitor Cst is connected to the driving voltage line 172, and the second storage electrode E2 is connected to the gate electrode G1 of the driving transistor T1, the second electrode D3 of the third transistor T3, and the second electrode D4 of the fourth transistor T4. As a result, the second storage electrode E2 determines the voltage of the gate electrode G1 of the driving transistor T1, and it receives the data voltage Dm through the second electrode D3 of the third transistor T3, or the initialization voltage Vint through the second electrode D4 of the fourth transistor T4.

An anode of the light emitting diode LED is connected to the second electrode D6 of the sixth transistor T6 and the first electrode S7 of the seventh transistor T7, and a cathode thereof is connected to the common voltage line 741 for transmitting the common voltage ELVSS.

In the exemplary embodiment of FIG. 1, the pixel circuit includes the seven transistors T1 to T7 and the one capacitor Cst, but it is not limited thereto, and the number of transistors and the number of capacitors and their connections may be variously changed.

An operation of one pixel of the light emitting diode display device in the exemplary embodiment will now be described with reference to FIGS. 1 and 2.

During an initialization period, the front scan signal Sn-1 of a low level is supplied to the pixel PX through the second scan line 152. In this case, the fourth transistor T4 to which the front scan signal Sn-1 of the low level is applied is turned on, so that the initialization voltage Vint is applied to the gate electrode G1 of the driving transistor T1 and the second storage electrode E2 of the storage capacitor Cst through the fourth transistor T4. Accordingly, the driving transistor T1 and the storage capacitor Cst are initialized. A voltage of the initialization voltage Vint is low such that the driving transistor T1 may be turned on.

In addition, during the initialization period, the bypass signal GB of a low level is applied to the seventh transistor T7. The seventh transistor T7 to which the bypass signal GB of the low level is applied is turned on, so that the initialization voltage Vint is applied to the anode of the light emitting diode LED through the seventh transistor T7. Accordingly, the anode of the light emitting diode LED is also initialized.

Thereafter, during a data writing period, the scan signal Sn of a low level is supplied to the pixel PX through the first scan line 151. The second transistor T2 and the third transistor T3 are turned on by the scan signal Sn of the low level.

When the second transistor T2 is turned on, the data voltage Dm is inputted to the first electrode S1 of the driving transistor T1 through the second transistor T2.

In addition, during the data writing period, the third transistor T3 is turned on, so that the second electrode D1 of the driving transistor T1 is electrically connected to the gate electrode G1 and the second storage electrode E2 of the storage capacitor Cst. The gate electrode G1 of the driving transistor T1 and the second electrode D1 are diode-connected. Further, since the low voltage (the initialization voltage Vint) is applied to the gate electrode G1 during the initialization period, the driving transistor T1 is in a turned-on state. Accordingly, the data voltage Dm inputted to the first electrode S1 of the driving transistor T1 is outputted from the second electrode D1 through a channel of the driving transistor T1, and then is stored in the second storage electrode E2 of the storage capacitor Cst through the third transistor T3.

In this case, the voltage applied to the second storage electrode E2 is changed according to a threshold voltage Vth of the driving transistor T1, the data voltage Dm is applied to the first electrode S1 of the driving transistor T1, and when the initialization voltage Vint is applied to the gate electrode G1 of the driving transistor T1, a voltage outputted in the second electrode D1 may be 'Vgs+Vth'. Herein, the Vgs is a difference between voltages applied to the gate electrode G1 and the first electrode S1 of the driving transistor T1, thus it may be 'Dm−Vint'. Therefore, the voltage that is outputted from the second electrode D1 and stored in the second storage electrode E2 may be 'Dm−Vint+Vth'.

Thereafter, during a light emitting period, since the light emitting control signal EM supplied from the light emitting control line 153 is a low level, the fifth transistor T5 and the sixth transistor T6 are turned on. As a result, the driving voltage ELVDD is applied to the first electrode S1 of the driving transistor T1, and the second electrode D1 of the driving transistor T1 is connected to the light emitting diode LED. The driving transistor T1 outputs the driving current Id according to a difference between the voltage of the gate electrode G1 and the voltage (i.e., the driving voltage ELVDD) of the first electrode S1. The driving current Id of the driving transistor T1 may have a value that is proportional to a squared value of 'Vgs−Vth'. Herein, the Vgs is a difference between voltages applied to both terminals of the storage capacitor Cst, and since the Vgs is 'Vg−Vs', it may be 'Dm−Vint+Vth−ELVDD'. Herein, when 'Vgs−Vth' is obtained by subtracting Vth, it is 'Dm−Vint−ELVDD'. That is, the driving current Id of the driving transistor T1 may be a current which is independent of a threshold voltage Vth of the driving transistor T1.

Therefore, it is possible to output an output current of the driving transistor T1 to be constant even though the driving transistors T1 disposed in respective pixels PX have different threshold voltages Vth due to process dispersion, thereby improving non-uniformity of the characteristics thereof.

In the above calculation formulas, when the transistor is a p-type transistor using a polycrystalline semiconductor, the Vth may be a value that is slightly larger than 0 or a negative value. In addition, signs of + and − may be changed depending on a direction in which the voltage is calculated. However, even in this case, the driving current Id which is an output current of the driving transistor T1 may have a value that is independent of the threshold voltage Vth.

When the above-described light emitting period ends, the same operation is repeated from the initialization period.

One of the first electrode and the second electrode of each of the plurality of transistors T1, T2, T3, T4, T5, T6, and T7 may be a source electrode and the other thereof may be a drain electrode, depending on a direction in which a voltage or current is applied.

In some exemplary embodiments, while the seventh transistor T7 initializes the anode of the light emitting diode LED in the initialization period, it may prevent even a small amount of current emitted under a condition in which the driving transistor T1 is not actually turned on from flowing toward the light emitting diode LED. In this case, the small amount of current is discharged through the seventh transistor T7 to a terminal of the initialization voltage Vint stage as a bypass current Ibp. Accordingly, the light emitting diode LED does not emit unnecessary light, so that a black gradation may be displayed more clearly and a contrast ratio may be improved. In this case, the bypass signal GB may be a signal having different timing from that of the front scan signal Sn-1. In some exemplary embodiments, the seventh transistor T7 may be omitted.

In the pixel PX operating as described above, the first layer may not particularly operate, and may be in a state in which a constant voltage is applied or in a ground state. The application of the constant voltage is intended to prevent a potential from being changed as a specific charge is injected into the first layer itself. The first layer may suppress the characteristic change of the first transistor T1 and have a desired characteristic while overlapping the first transistor T1.

Figure 3:
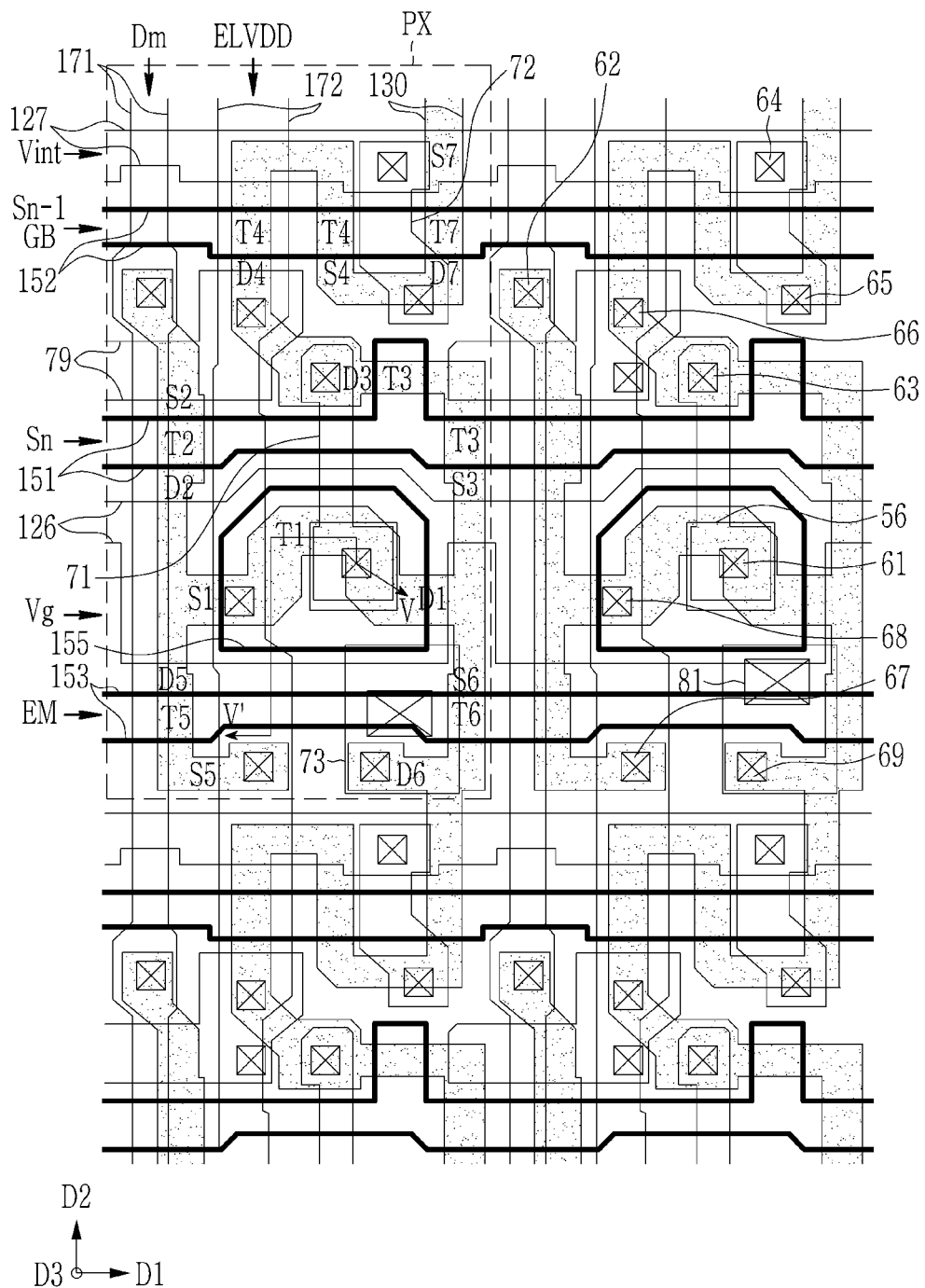
FIG. 3 illustrates a plan view of an exemplary embodiment of a partial region of a light emitting diode display device.
Figure 4:
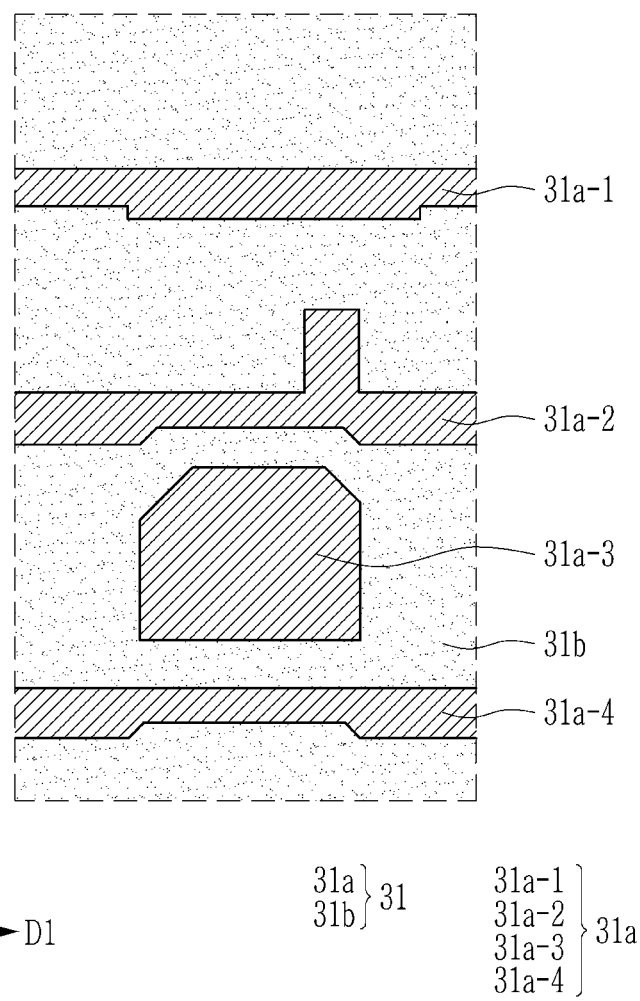
FIG. 4 illustrates a plan view of an exemplary embodiment of a first layer.
Figure 5:
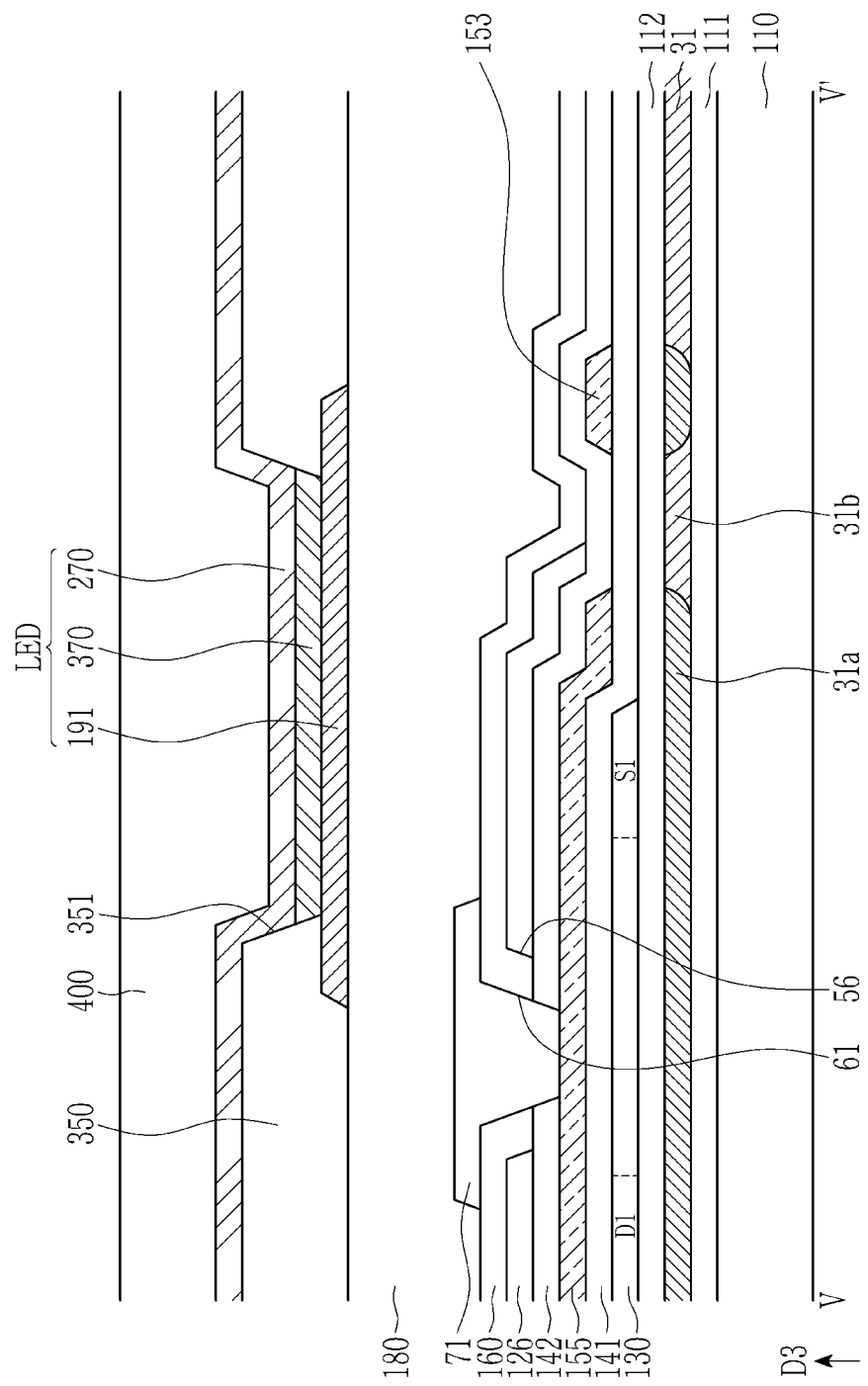
FIG. 5 illustrates a cross-sectional view taken along line V-V' of FIG. 3.

Hereinafter, an exemplary embodiment of a pixel and a first layer 31 of the light emitting diode display device will be described with reference to FIGS. 3 to 5. FIG. 3 illustrates a plan view of an exemplary embodiment of a partial region of a light emitting diode display device, FIG. 4 illustrates a plan view of an exemplary embodiment of a first layer, and FIG. 5 illustrates a cross-sectional view taken along line V-V' of FIG. 3.

Referring to FIG. 3, the light emitting diode display device in the exemplary embodiment includes the first scan line 151 extending along a first direction D1 and transmitting the scan signal Sn, the second scan line 152 for transmitting the front scan signal Sn-1, the light emitting control line 153 for transmitting the light emitting control signal EM, and the initializing voltage line 127 for transmitting the initialization voltage Vint. The bypass signal GB is transmitted through the second scan line 152.

The light emitting diode display device includes the data line 171 extending along a second direction D2 perpendicular to the first direction D1 and transmitting the data voltage Dm, and the driving voltage line 172 for transmitting the driving voltage ELVDD.

The light emitting diode display device includes the driving transistor T1, the second transistor T2, the third transistor T3, the fourth transistor T4, the fifth transistor T5, the sixth transistor T6, the seventh transistor T7, the storage capacitor Cst, and the light emitting diode LED.

A channel of each of the driving transistor T1, the second transistor T2, the third transistor T3, the fourth transistor T4, the fifth transistor T5, the sixth transistor T6, and the seventh transistor T7 is positioned in a semiconductor layer 130 (refer to FIG. 5) extending long. In addition, at least some of the first and second electrodes of the plurality of transistors T1, T2, T3, T4, T5, T6, and T7 are also positioned in the semiconductor layer 130. The semiconductor layer 130 (a portion in which shading is added in FIG. 3) may be variously bent. The semiconductor layer 130 may include a polycrystalline semiconductor such as polysilicon, or an oxide semiconductor.

The semiconductor layer 130 includes a channel doped with n-type impurities or p-type impurities, and a first doped region and a second doped region that are positioned at opposite sides of the channel have a higher doping concentration than that of the impurities doped in the channel. The first doped region and the second doped region respectively correspond to the first electrodes and the second electrodes of the plurality of transistors T1, T2, T3, T4, T5, T6, and T7. When one of the first doped region and the second doped region is a source region, the other one is a drain region. In addition, in the semiconductor layer 130, regions between the first and second electrodes of two different transistors are also doped, so that the two transistors may be electrically connected to each other.

Each of the channels of the plurality of transistors T1, T2, T3, T4, T5, T6, and T7 overlaps the gate electrode of each of the transistors T1, T2, T3, T4, T5, T6, and T7, and is positioned between the first electrode and the second electrode of each of the transistors T1, T2, T3, T4, T5, T6, and T7. The plurality of transistors T1, T2, T3, T4, T5, T6, and T7 may have substantially the same stacked structure. Hereinafter, the driving transistor T1 will be mainly described in detail, and the remaining transistors T2, T3, T4, T5, T6, and T7 will be briefly described.

The driving transistor T1 includes a channel, a first gate electrode 155, the first electrode S1, and the second electrode D1. The channel of the driving transistor T1 is between the first electrode S1 and the second electrode D1, and overlaps the first gate electrode 155 in a plan view. The channel is curved in order to form a long channel in a limited region. A driving range of the gate voltage Vg applied to the first gate electrode 155 of the driving transistor T1 is widened as a length of the channel increases, and the driving current Id steadily increases in accordance with the gate voltage Vg. Accordingly, a gray of light emitted from the light emitting diode LED may be finely controlled by changing the gate voltage Vg, and the display quality of the light emitting diode display device may also be improved. In addition, since the channel extends in several directions rather than extending in one direction, effects due to directionality are offset in a manufacturing process, thereby reducing an effect of process dispersion. Therefore, it is possible to prevent degradation in image quality such as spot defects (for example, a luminance difference occurring depending on pixels even when the same data voltage Dm is applied) capable of occurring due to the characteristic of the driving transistor T1 that is varied according to the region of the display device due to the process dispersion. The shape of the channel is not limited to the illustrated horseshoe shape ($\Omega$ shape), and the channel may have various shapes.

The first gate electrode 155 overlap the channel in a plan view. The first and second electrodes S1 and D1 are disposed at opposite sides of the channel. An extended portion of a storage line 126 is isolated and disposed on the first gate electrode 155. The extended portion of the storage line 126 overlaps the first gate electrode 155 with a second gate insulating film therebetween in a plan view to form the storage capacitor Cst. The extended portion of the storage line 126 is a first storage electrode (E1 of FIG. 1) of the storage capacitor Cst, and the first gate electrode 155 is a second storage electrode (E2 of FIG. 1). The extended portion of the storage line 126 is provided with an opening 56 so that the gate electrode 155 may be connected to a first data connecting member 71. In the opening 56, an upper surface of the first gate electrode 155 and the first data connecting member 71 are electrically connected through a contact hole 61. The first data connecting member 71 is connected to the second electrode D3 of the third transistor T3 to connect the first gate electrode 155 of the driving transistor T1 and the second electrode D3 of the third transistor T3.

The gate electrode of the second transistor T2 may be a portion of the first scan line 151. The data line 171 is connected to the first electrode S2 of the second transistor T2 through a contact hole 62. The first electrode S2 and the second electrode D2 may be disposed on the semiconductor layer 130.

The third transistor T3 may be configured of two transistors adjacent to each other. In the pixel PX of FIG. 3, symbol T3 is illustrated at a left side and a lower side with respect to the bent portion of the semiconductor layer 130. These two portions serve as the third transistor T3, and the first electrode S3 of one third transistor T3 is connected to the second electrode D3 of the other third transistor T3. The gate electrodes of the two transistors T3 may be a part of the first scan line 151 or a part protruding upward from the first scan line 151. Such a structure may be regarded as a dual gate structure and may block a leakage current from flowing. The first electrode S3 of the third transistor T3 is connected to the first electrode S6 of the sixth transistor T6 and the second electrode D1 of the driving transistor T1. The second electrode D3 of the third transistor T3 is connected to the first data connecting member 71 through a contact hole 63.

The fourth transistor T4 includes two fourth transistors T4, and the two fourth transistors T4 are disposed at a position at which the second scan line 152 and the semiconductor layer 130 meet. The gate electrode of the fourth transistor T4 may be a part of the second scan line 152. The first electrode S4 of one fourth transistor T4 is connected to the second electrode D4 of the other fourth transistor T4. Such a structure may be regarded as a dual gate structure and may serve to block a leakage current. A second data connecting member 72 is connected to the first electrode S4 of the fourth transistor T4 through a contact hole 65, and the first data connecting member 71 is connected to the second electrode D2 of the fourth transistor T4 through the contact hole 63.

As described above, the third transistor T3 and the fourth transistor T4 may be provided to have the dual gate structure to effectively prevent a leakage current from being generated by blocking an electron movement path of a channel in an off state.

The gate electrode of the fifth transistor T5 may be a part of the light emitting control line 153. The driving voltage line 172 is connected to the first electrode S5 of the fifth transistor T5 through a contact hole 67, and the second electrode D5 is connected to the first electrode S1 of the driving transistor T1 through the semiconductor layer 130.

The gate electrode of the sixth transistor T6 may be a part of the light emitting control line 153. A third data connecting member 73 is connected to the second electrode D6 of the sixth transistor T6 through a contact hole 69, and the first electrode S6 is connected to the second electrode D1 of the driving transistor through the semiconductor layer 130.

The gate electrode of the seventh transistor T7 may be a part of the second scan line 152. The first electrode S7 of the seventh transistor T7 is connected to the second electrode D6 of the sixth transistor T6, and the second electrode D7 is connected to the first electrode S4 of the fourth transistor T4.

The storage capacitor Cst includes the first storage electrode E1 and the second storage electrode E2 which overlap each other with a second gate insulating film 142 therebetween. The second storage electrode E2 corresponds to the gate electrode 155 of the driving transistor T1, and the first storage electrode E1 may be the extended portion of the storage line 126. Herein, the second gate insulating film 142 becomes a dielectric, and a capacitance is determined by a charge stored in the storage capacitor Cst and a voltage between the first and second storage electrodes E1 and E2. By using the first gate electrode 155 as the second storage electrode E2, a space capable of forming the storage capacitor Cst in a space that is narrowed by the channel of the driving transistor T1 occupying a large area in the pixel may be secured.

The driving voltage line 172 is connected to the first storage electrode E1 through a contact hole 68. Accordingly, the storage capacitor Cst stores a charge corresponding to a difference between the driving voltage ELVDD transmitted to the first storage electrode E1 through the driving voltage line 172 and the gate voltage Vg of the gate electrode 155.

The second data connecting member 72 is connected to the initializing voltage line 127 through a contact hole 64. An electrode referred to as a pixel electrode is connected to the third data connecting member 73 through a contact hole 81.

A parasitic capacitor control pattern 79 may be disposed between dual gate electrodes of the third transistor (also referred to as "compensation transistor") T3. A parasitic capacitor exists in the pixel, and image quality characteristics may change when the voltage applied to the parasitic capacitor is changed. The driving voltage line 172 is connected to the parasitic capacitor control pattern 79 through a contact hole 66. Therefore, it is possible to prevent the image quality characteristic from being changed by applying the driving voltage ELVDD, which is a constant direct current ("DC") voltage, to the parasitic capacitor. The parasitic capacitor control pattern 79 may be disposed in a different area from that shown, and a voltage other than the driving voltage ELVDD may be applied.

One end of the first data connecting member 71 is connected to the gate electrode 155 through the contact hole 61, and the other end thereof is connected to the second electrode D3 of the third transistor T3 and the second electrode D4 of the fourth transistor T4 through the contact hole 63.

One end of the second data connecting member 72 is connected to the first electrode S4 of the fourth transistor T4 through the contact hole 65, and the other end thereof is connected to the initializing voltage line 127 through the contact hole 64.

The third data connecting member 73 is connected to the second electrode of the sixth transistor T6 through the contact hole 69.

Referring to FIG. 4, the first layer 31 will be described in detail.

The light emitting diode display device in the exemplary embodiment includes the first layer 31. The first layer 31 may overlap a front surface of a substrate 110. The first layer 31 is disposed between the substrate 110 and the semiconductor layer 130 to be described later.

The first layer 31 includes a first region 31a and a second region 31b having conductivity. The first layer 31 may include the first region 31a including a first material and the second region 31b including a second material. The first material and the second material may be different materials that may be distinguished from each other. The first layer 31 may include a semiconductor material. In an exemplary embodiment, the first material included in the first region 31a may include amorphous silicon doped with impurities, and the second material included in the second region 31b may include amorphous silicon. The impurity doped in the first region 31a may be a Group 5 element, and the first region 31a may be an n+ doped region.

The first region 31a may have substantially the same planar shape as that of a first gate conductor. An impurity may be doped on an amorphous silicon layer by the same mask as that used in a process of forming the first gate conductor. Accordingly, the impurity-doped first region 31a may have substantially the same shape as that of the first gate conductor. An edge of the first region 31a may be substantially aligned with that of the first gate conductor.

In FIG. 3, the first gate conductor is shown as a bold line. The first gate conductor may include the first gate electrode 155, the first scan line 151, the second scan line 152, and the light emitting control line 153.

The first region 31a includes at least one of a first sub-region 31a-1 overlapping the second scan line 152, a second sub-region 31a-2 overlapping the first scan line 151, a third sub-region 31a-3 overlapping the first gate electrode 155, and a fourth sub-region 31a-4 overlapping the light emitting control line 153. The first region 31a in the exemplary embodiment may include all of the first sub-region 31a-1 overlapping the second scan line 152, the second sub-region 31a-2 overlapping the first scan line 151, the third sub-region 31a-3 overlapping the first gate electrode 155, and the fourth sub-region 31a-4 overlapping the light emitting control line 153, but the invention is not limited thereto, and the first region 31a may be modified by the configuration of the first gate conductor.

The first sub-region 31a-1 may have substantially the same planar shape as that of the second scan line 152. Edges of the first sub-region 31a-1 and the second scan line 152 may be substantially aligned. The first sub-region 31a-1 may have a shape extending along the first direction D1 like the second scan line 152.

The first sub-region 31a-1 may overlap the semiconductor layer 130 between the first electrode S4 and the second electrode D4 of the fourth transistor T4 and between the first electrode S7 and the second electrode D7 of the seventh transistor T7.

The first sub-region 31a-1 may overlap the data line 171 and the driving voltage line 172 extending along the second direction D2. In addition, the first sub-region 31a-1 may overlap the second data connecting member 72.

The second sub-region 31a-2 may have substantially the same planar shape as that of the first scan line 151. Edges of the second sub-region 31a-2 and the first scan line 151 may be substantially aligned. The second sub-region 31a-2 may have a shape extending along the first direction D1 like the first scan line 151, and a portion of the region thereof may have a shape protruding along the second direction D2.

The second sub-region 31a-2 may overlap the semiconductor layer 130 between the first electrode S2 and the second electrode D2 of the second transistor T2 and between the first electrode S3 and the second electrode D3 of the third transistor T3.

The second sub-region 31a-2 may overlap the data line 171 and the driving voltage line 172 extending along the second direction D2. In addition, the second sub-region 31a-2 may overlap the first data connecting member 71.

The third sub-region 31a-3 may have substantially the same planar shape as that of the first gate electrode 155. Edges of the third sub-region 31a-3 and the first gate electrode 155 may be substantially aligned.

The third sub-region 31a-3 may overlap the semiconductor layer 130 forming the first transistor T1. The third sub-region 31a-3 may overlap the first electrode S1 and the second electrode D1 of the first transistor T1, and the channel disposed therebetween.

In addition, the third sub-region 31a-3 may overlap the driving voltage line 172 extending in the second direction D2, and may overlap a part of the first data connecting member 71.

The fourth sub-region 31a-4 may have substantially the same planar shape as that of the light emitting control line 153. Edges of the fourth sub-region 31a-4 and the light emitting control line 153 may be substantially aligned. The fourth sub-region 31a-4 may have a shape extending along the first direction D1 like the light emitting control line 153.

The fourth sub-region 31a-4 may overlap the semiconductor layer 130 between the first electrode S5 and the second electrode D5 of the fifth transistor T5 and between the first electrode S6 and the second electrode D6 of the sixth transistor T6.

In addition, the fourth sub-region 31a-4 may overlap the data line 171 and the driving voltage line 172 extending in the second direction D2, and may overlap a part of the third data connecting member 73.

Hereinafter, the exemplary embodiment of a cross-sectional structure of the light emitting diode display device will be described with reference to FIGS. 3 and 4 in addition to FIG. 5.

The light emitting diode display device in the exemplary embodiment includes the substrate 110.

The substrate 110 may include a plastic layer and a barrier layer. The plastic layer and the barrier layer may be alternatively stacked.

In an exemplary embodiment, the plastic layer may include at least one of polyether sulfone ("PES"), polyacrylate ("PAR"), polyether imide ("PEI"), polyimide imide, polyethylene naphthalate ("PEN"), polyethylene terephthalate ("PET"), polyphenylene sulfide ("PPS"), polyarylate, polyimide ("PI"), polycarbonate ("PC"), poly(arylene ether sulfone), and a combination thereof.

The barrier layer may include at least one of a silicon oxide, a silicon nitride, and an aluminum oxide, but is not limited thereto, and may include any inorganic material.

An adhesive layer 111 is disposed on the substrate 110. The adhesive layer 111 may be provided for bonding the substrate 110 and the first layer 31, and the adhesive layer 111 may be omitted in another exemplary embodiment.

The first layer 31 is disposed on the adhesive layer 111. The first layer 31 includes the first region 31a and the second region 31b having conductivity.

A thickness of the first region 31a may become smaller toward an end of the first region 31a. As shown in FIG. 5, the end of the first region 31a may have an inclined shape with respect to one surface of the substrate 110.

Since other description of the first layer 31 is given above with reference to FIG. 4, a detailed description thereof will be omitted below.

A buffer layer 112 is disposed on the first layer 31. In an exemplary embodiment, the buffer layer 112 may include an inorganic insulating material such as a silicon oxide, a silicon nitride, or an aluminum oxide, or may include an organic insulating material such as polyimide acryl.

The semiconductor layer 130 including a channel of the plurality of transistors T1, T2, T3, T4, T5, T6, and T7, the first electrode, and the second electrode is disposed on the buffer layer 112.

A first gate insulating film 141 is disposed on the semiconductor layer 130. The first gate conductor including the first gate electrode 155, the first scan line 151, the second scan line 152, and the light emitting control line 153 is disposed on the first gate insulating film 141.

The first gate conductor and the first region 31a in the exemplary embodiment may have substantially the same planar shape. An end of the first region 31a may be aligned with that of the first gate conductor. The first region 31a and the first gate conductor may completely overlap each other in a plan view.

The second gate insulating film 142 covering the first gate conductor is disposed on the first gate conductor. In an exemplary embodiment, the first gate insulating film 141 and the second gate insulating film 142 may include an inorganic insulating material such as a silicon nitride, a silicon oxide, and an aluminum oxide, or an organic insulating material.

A second gate conductor including the storage line 126, the initializing voltage line 127, and the parasitic capacitor control pattern 79 is disposed on the second gate insulating film 142.

An interlayer insulating film 160 covering the second gate conductor is disposed on the second gate conductor. In an exemplary embodiment, the interlayer insulating film 160 may include an inorganic insulating material such as a silicon nitride, a silicon oxide, and an aluminum oxide, or may include an organic insulating material.

A data conductor including the data line 171, the driving voltage line 172, the first data connecting member 71, the second data connecting member 72, and the third data connecting member 73 is disposed on the interlayer insulating film 160. The first data connecting member 71 may be connected to the first gate electrode 155 through the contact hole 61.

A passivation film 180 covering the data conductor is disposed on the data conductor. In an exemplary embodiment, the passivation film 180 may be a planarization film, and may include an organic insulating material or an inorganic insulating material.

A pixel electrode 191 is disposed on the passivation film 180. The pixel electrode 191 is connected to the third data connecting member 73 through the contact hole 81 defined in the passivation film 180.

A partition wall 350 is disposed on the passivation film 180 and the pixel electrode 191. The partition wall 350 has an opening 351 overlapping the pixel electrode 191. A light emitting layer 370 is disposed in the opening 351. A common electrode 270 is disposed on the light emitting layer 370 and the partition wall 350. The pixel electrode 191, the light emitting layer 370, and the common electrode 270 form a light emitting diode LED.

In some exemplary embodiments, the pixel electrode may be an anode which is a hole injection electrode, and the common electrode may be a cathode which is an electron injection electrode. In contrast, the pixel electrode may be a cathode, and the common electrode may be an anode. When holes and electrons are injected into the light emitting layer from the pixel electrode and the common electrode, respectively, light is emitted when excitons in which the injected holes and electrons are combined enter a ground state from an excited state.

An encapsulation layer 400 for protecting the light emitting device LED is disposed on the common electrode 270. The encapsulation layer 400 may be in contact with the common electrode 270 as shown, and in some exemplary embodiments, it may be spaced apart from the common electrode 270.

The encapsulation layer 400 may be a thin film encapsulation layer in which an inorganic film and an organic film are stacked, and may include a triple layer including an inorganic film, an organic film, and an inorganic film. In some exemplary embodiments, a capping layer and a functional layer may be disposed between the common electrode 270 and the encapsulation layer 400.

Figure 6:
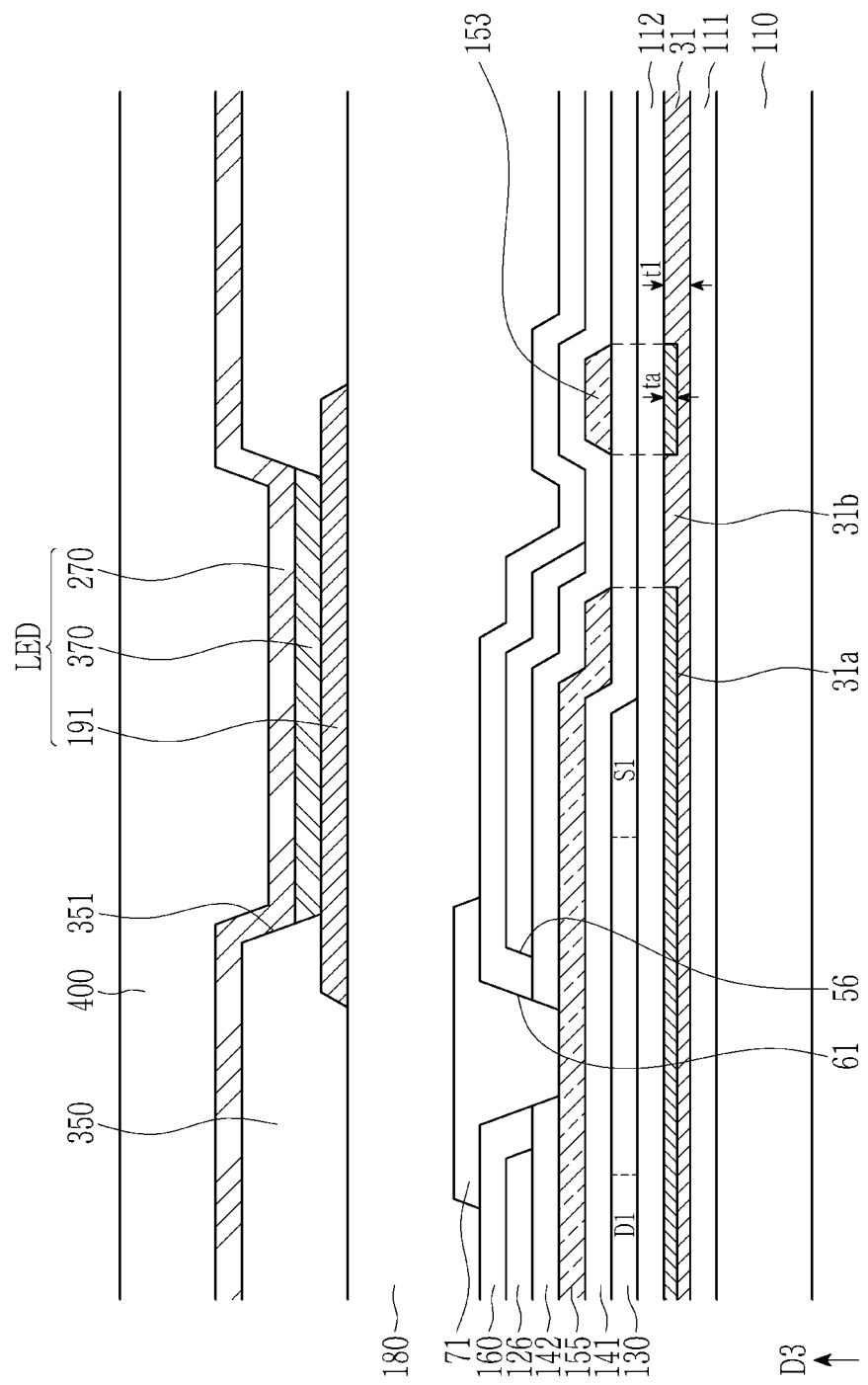
FIG. 6 illustrates a cross-sectional view of an exemplary embodiment of a light emitting diode display device.
Figure 7:
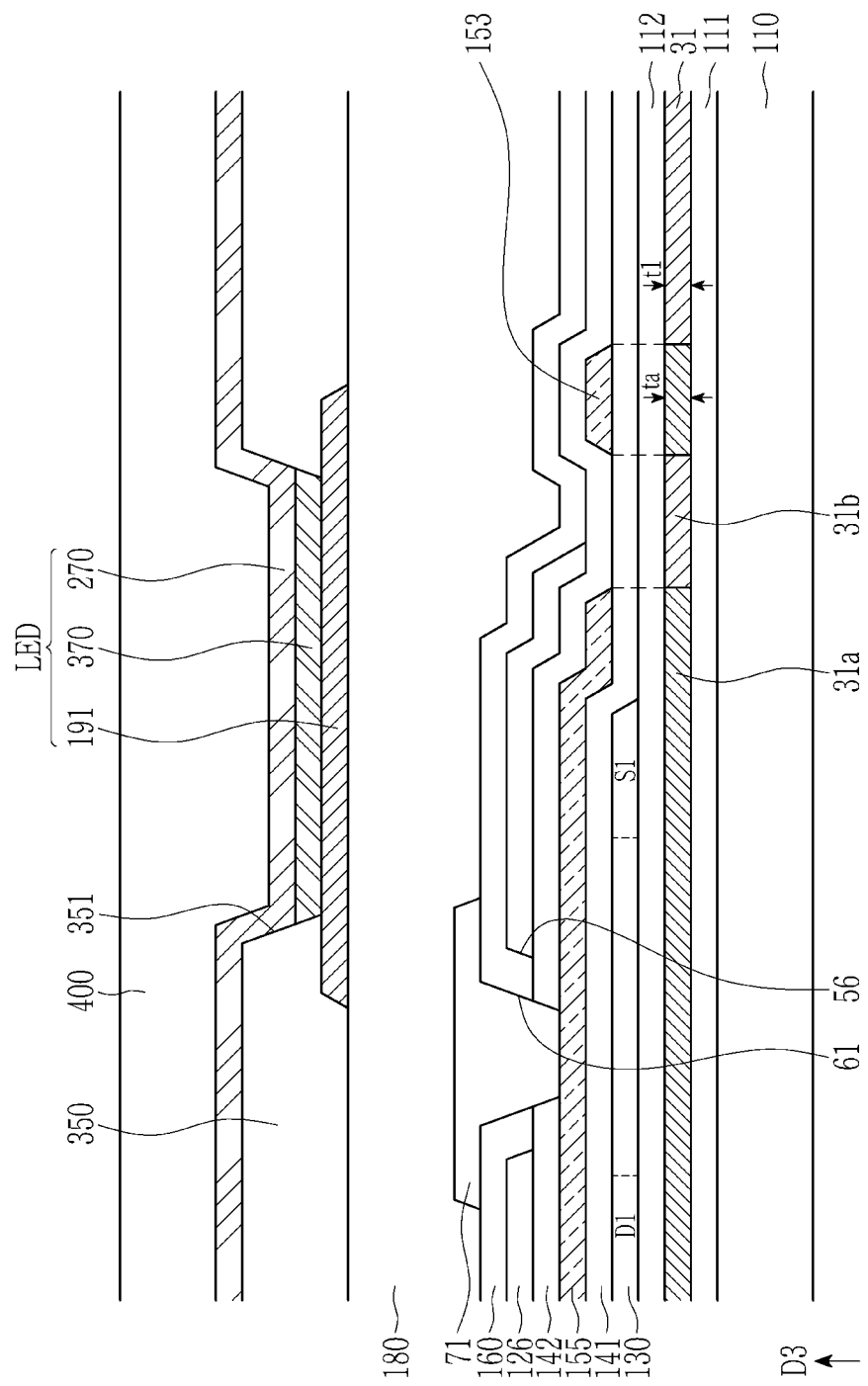
FIG. 7 illustrates a cross-sectional view of an exemplary embodiment of a light emitting diode display device.

Hereinafter, an exemplary embodiment of a light emitting diode display device will be described with reference to FIGS. 6 and 7. FIG. 6 illustrates a cross-sectional view of an exemplary embodiment of a light emitting diode display device, and FIG. 7 illustrates a cross-sectional view of an exemplary embodiment of a light emitting diode display device. A description of the same or similar constituent elements as those of the exemplary embodiments described above will be omitted.

Referring to FIG. 6, a maximum thickness ta of the first region 31a in the first layer 31 may be smaller than a maximum thickness t1 of the first layer 31. The first region 31a may be provided by doping only a part of the first layer 31 in a thickness direction with an impurity. The first region 31a may be provided by adjusting a doping depth of the impurity doped in the first layer 31.

Referring to FIG. 7, the first region 31a may have substantially the same thickness. The thickness ta of the first region 31a and the thickness t1 of the first layer 31 may be the same. In addition, the first region 31a in the exemplary embodiment may have a uniform thickness. An end of the first region 31a may be aligned with that of the first gate conductor.

Figure 8:
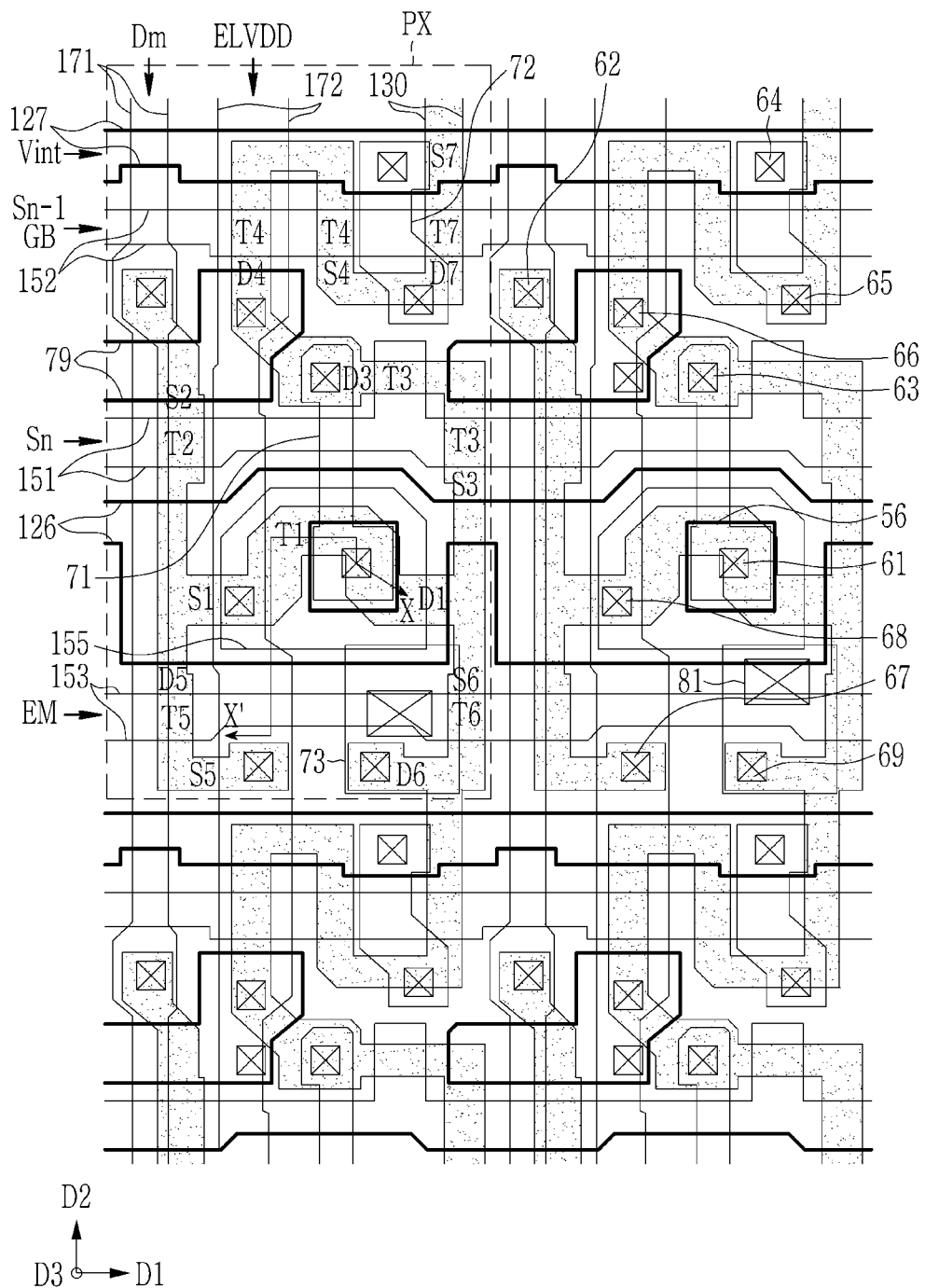
FIG. 8 illustrates a plan view of an exemplary embodiment of a partial region of a light emitting diode display device.
Figure 9:
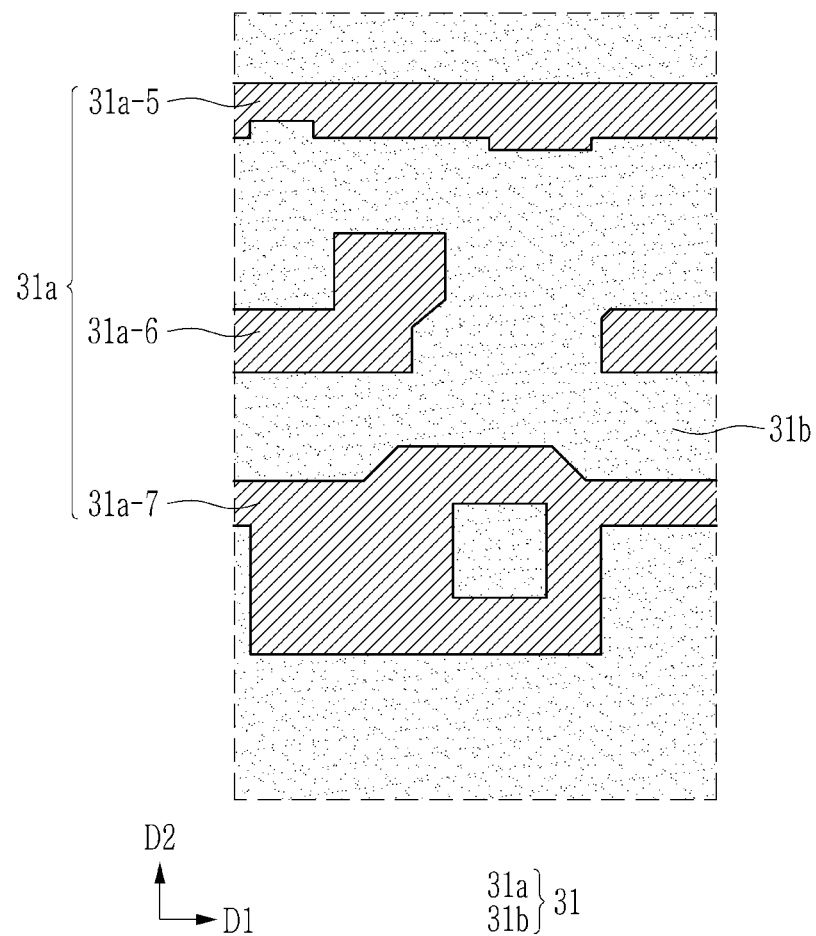
FIG. 9 illustrates a plan view of an exemplary embodiment of a first layer.
Figure 10:
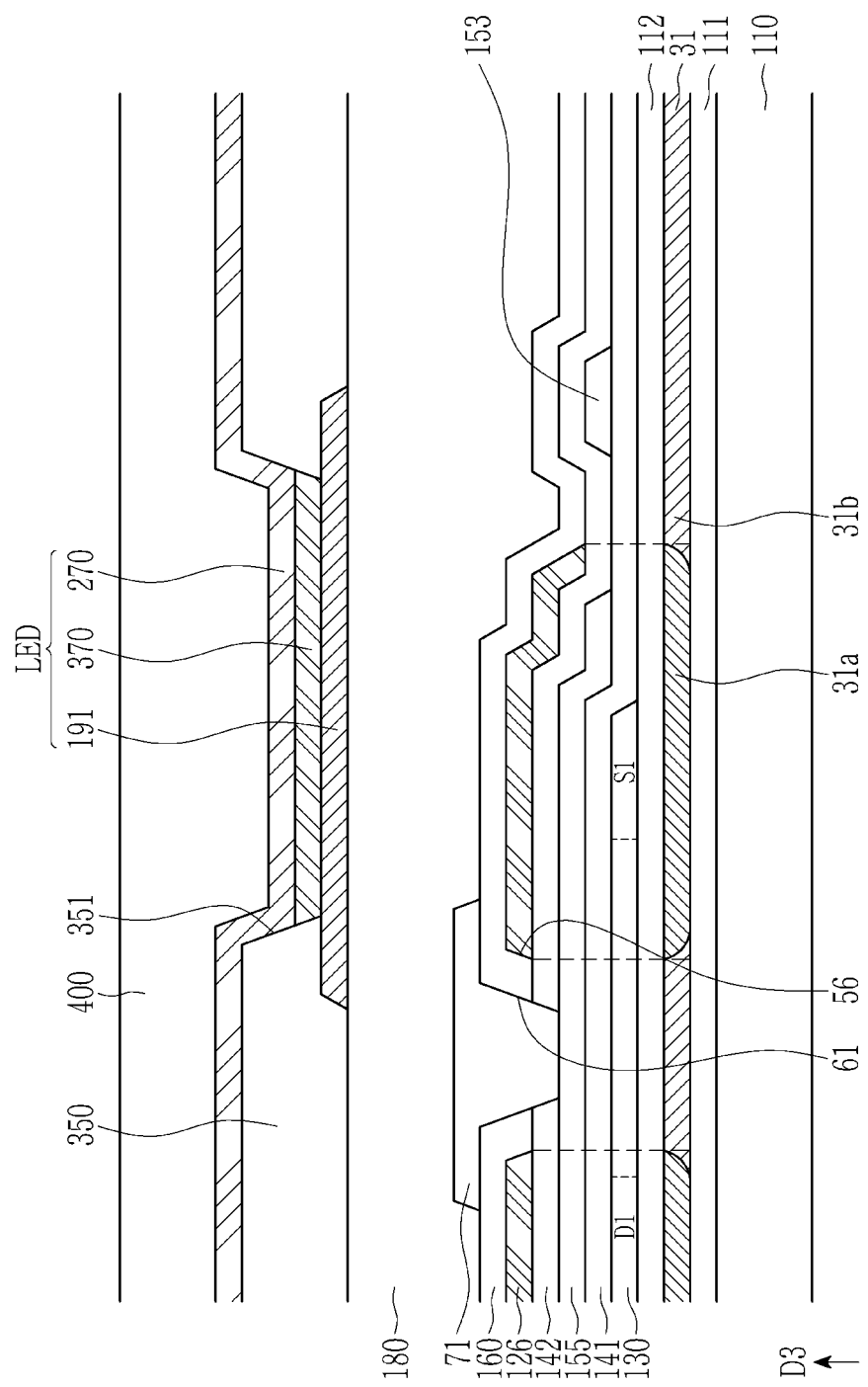
FIG. 10 illustrates a cross-sectional view taken along line X-X' of FIG. 8.

Hereinafter, an exemplary embodiment of a light emitting diode display device will be described with reference to FIGS. 8 to 10. FIG. 8 illustrates a plan view of an exemplary embodiment of a partial region of a light emitting diode display device, FIG. 9 illustrates a plan view of an exemplary embodiment of a first layer, and FIG. 10 illustrates a cross-sectional view taken along line X-X' of FIG. 8. A description of the same or similar constituent elements as those of the exemplary embodiments described above will be omitted.

In FIG. 8, an area in which the second gate conductor is disposed is indicated by a bold line. The second gate conductor may include the storage line 126 including the first storage electrode, the initializing voltage line 127, and the parasitic capacitor control pattern 79.

As shown in FIG. 9, the first layer 31 includes the first region 31a and the second region 31b having conductivity. The first layer 31 may include a semiconductor material, and for example, the first region 31a may include amorphous silicon doped with impurities, and the second region 31b may include amorphous silicon. The second region 31b may also include some impurities, but a concentration of the doped impurity in the first region 31a may be greater than that of the doped impurity in the second region 31b. The first region 31a may have conductivity similar to that of a metal.

The first region 31a may have substantially the same planar shape as that of the second gate conductor. The first region 31a may be provided by the same mask as that used in a process of forming the second gate conductor. Specifically, the first region 31a having substantially the same planar shape as that of the second gate conductor may be provided by disposing a mask used in a process of forming the second gate conductor on an amorphous silicon layer and doping impurities.

The first region 31a includes at least one of a fifth sub-region 31a-5 overlapping the initializing voltage line 127, a sixth sub-region 31a-6 overlapping the parasitic capacitor control pattern 79, and a seventh sub-region 31a-7 overlapping the storage line 126. Herein, the exemplary embodiment in which the first region 31a includes all of the fifth sub-region 31a-5 overlapping the initializing voltage line 127, the sixth sub-region 31a-6 overlapping the parasitic capacitor control pattern 79, and the seventh sub-region 31a-7 overlapping the storage line 126 is illustrated, but the invention is not limited thereto, and the first region 31a may be modified by the configuration of the second gate conductor.

The fifth sub-region 31a-5 may have substantially the same planar shape as that of the initializing voltage line 127. Edges of the fifth sub-region 31a-5 and the initializing voltage line 127 may be substantially aligned. The fifth sub-region 31a-5 may have a shape extending along the first direction D1 like the initializing voltage line 127.

The fifth sub-region 31a-5 may overlap the semiconductor layer 130 between the first electrode S4 and the second electrode D4 of the fourth transistor T4, and may overlap the first electrode S7 of the seventh transistor T7.

The fifth sub-region 31a-5 may overlap the data line 171 and the driving voltage line 172 extending along the second direction D2. In addition, the fifth sub-region 31a-5 may partially overlap the second data connecting member 72.

The sixth sub-region 31a-6 may have substantially the same planar shape as that of the parasitic capacitor control pattern 79. Edges of the sixth sub-region 31a-6 and the parasitic capacitor control pattern 79 may be substantially aligned.

The sixth sub-region 31a-6 may overlap the data line 171 and the driving voltage line 172 extending along the second direction D2. In addition, in the semiconductor layer 130, the sixth sub-region 31a-6 may overlap a part of the third transistor T3, the first electrode S2 of the second transistor T2, and the second electrode D4 of the fourth transistor T4.

The seventh sub-region 31a-7 may have substantially the same planar shape as that of the storage line 126. Edges of the seventh sub-region 31a-7 and the storage line 126 may be substantially aligned. The seventh sub-region 31a-7 may extend along the first direction D1 like the storage line 126, and may include an extended region and a removed region.

The seventh sub-region 31a-7 may overlap the data line 171 and the driving voltage line 172 extending along the second direction D2. In addition, the seventh sub-region 31a-7 may overlap the first data connecting member 71 and the first gate electrode 155. The seventh sub-region 31a-7 may overlap the first transistor T1.

Hereinafter, a cross-sectional structure of the first layer 31 will be described while additionally referring to FIG. 10. A description of the same configurations as the above-described configurations will be omitted.

The first layer 31 is disposed on the adhesive layer 111. The first layer 31 includes the first region 31a and the second region 31b having conductivity.

The thickness of the first region 31a may become smaller toward the end of the first region 31a. As shown in FIG. 10, the end of the first region 31a may have the inclined shape with respect to one surface of the substrate 110.

The second gate conductor and the first region 31a in the exemplary embodiment may have substantially the same planar shape. The end of the first region 31a may be aligned with that of the second gate conductor.

Figure 11:
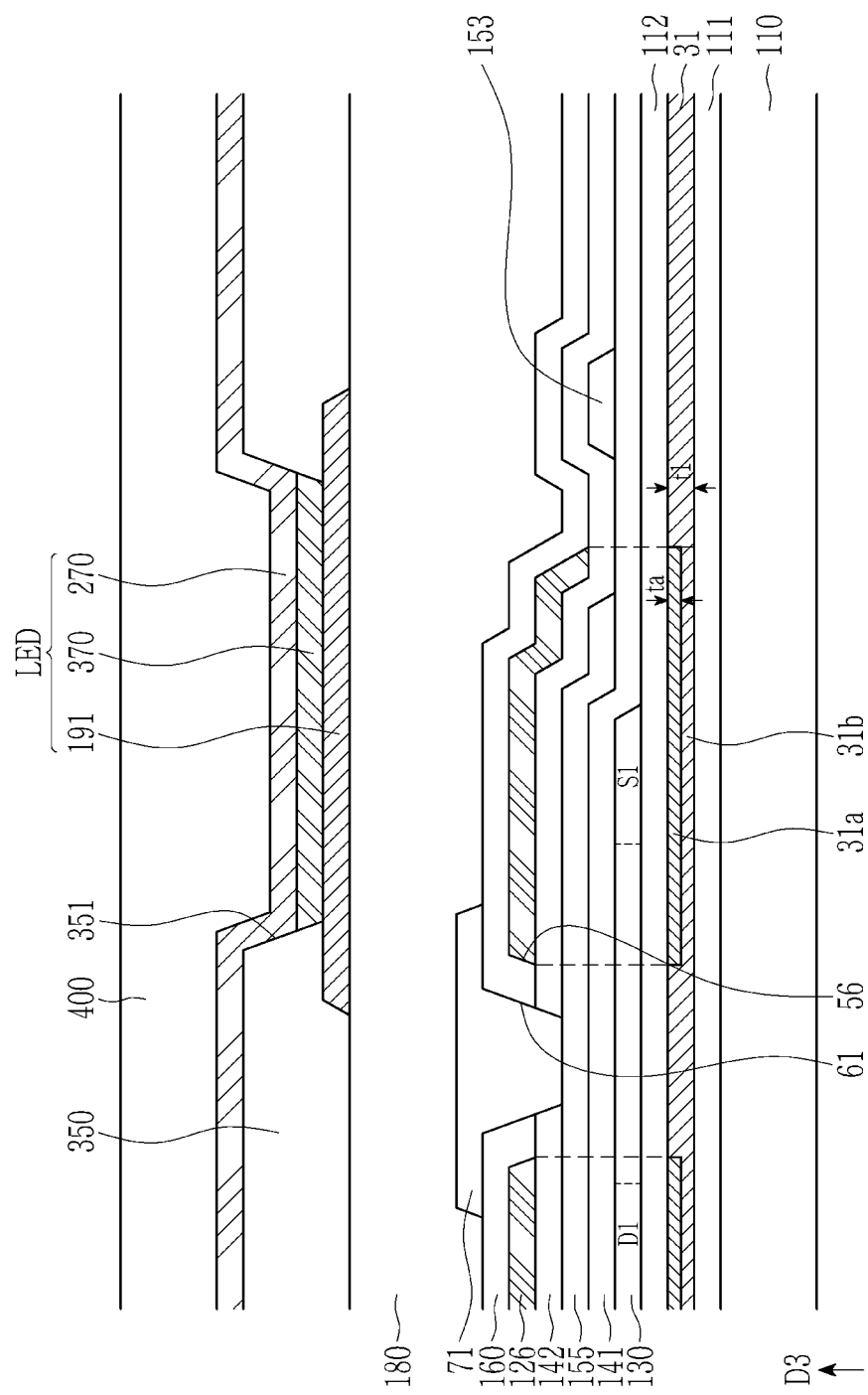
FIG. 11 illustrates a cross-sectional view of an exemplary embodiment of a light emitting diode display device.

Hereinafter, an exemplary embodiment of a light emitting diode display device will be described with reference to FIGS. 11 and 12. FIG. 11 illustrates a cross-sectional view of an exemplary embodiment of a light emitting diode display device, and FIG. 12 illustrates a cross-sectional view of an exemplary embodiment of a light emitting diode display device.

Referring to FIG. 11, the maximum thickness t0 of the first region 31a in the first layer 31 may be smaller than the maximum thickness t1 of the first layer 31. The first region 31a may be provided by doping only a part of the first layer 31 with an impurity in the thickness direction D3 of the first layer 31. The first region 31a may be provided to be thinner than the first layer 31 by adjusting the doping depth thereof.

Figure 12:
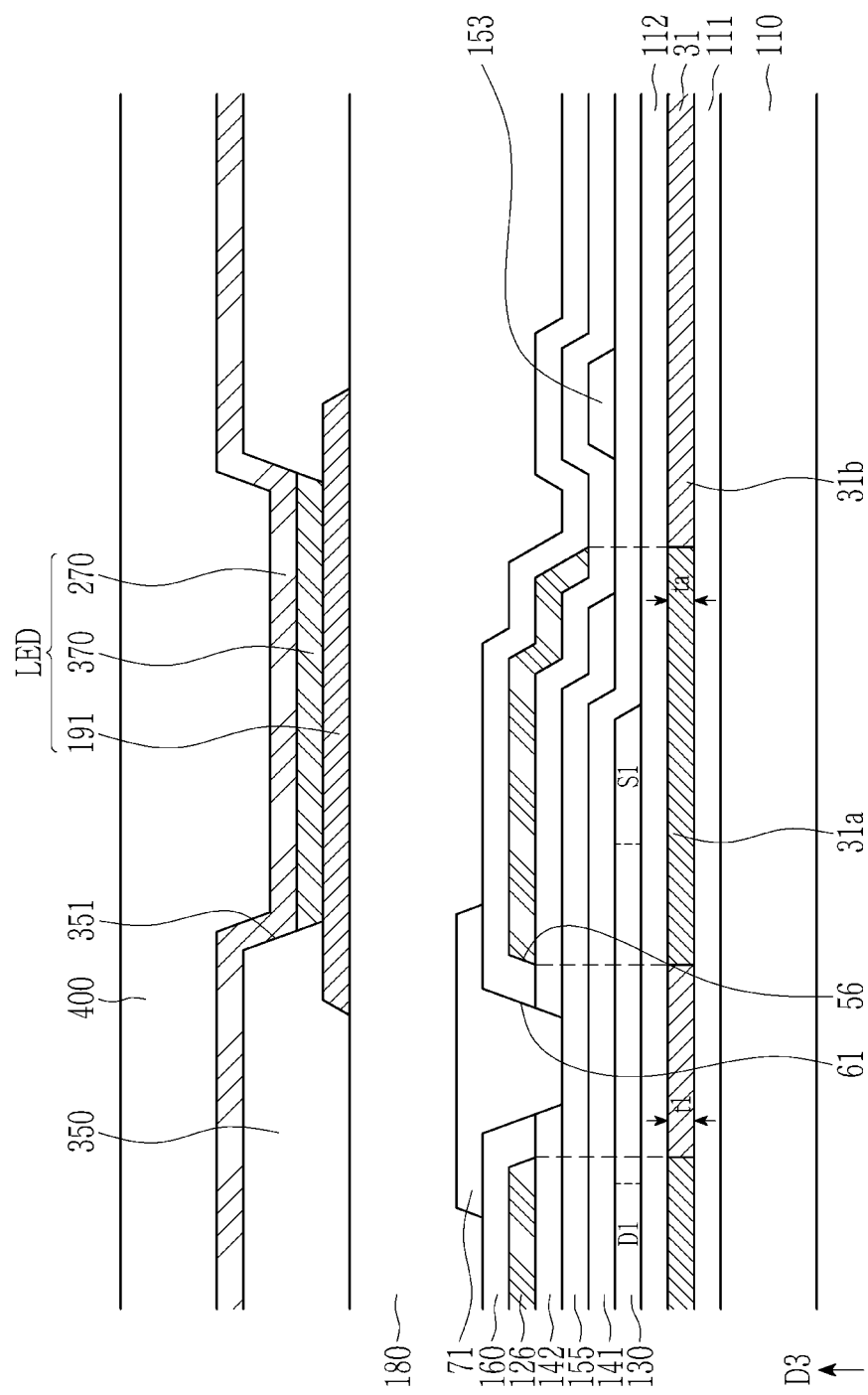
FIG. 12 illustrates a cross-sectional view of an exemplary embodiment of a light emitting diode display device.

Referring to FIG. 12, the first region 31a may have substantially the same thickness as the first layer 31. The first region 31a may have a substantially uniform thickness. The end of the first region 31a may be perpendicular to the substrate 110. The end of the first region 31a having the perpendicular shape may be aligned with that of the second gate conductor.

Figure 13:
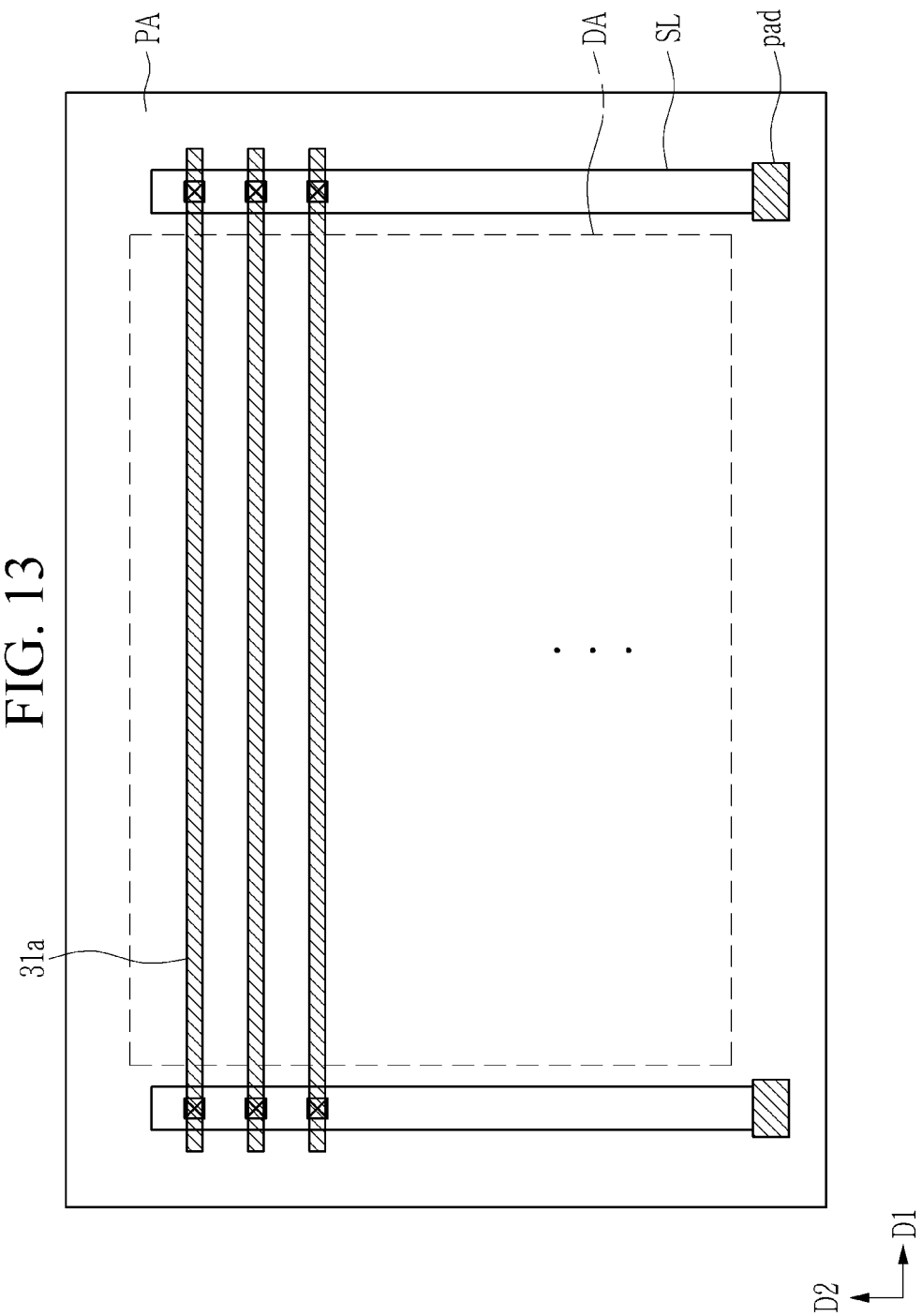
FIG. 13 illustrates a schematic plan view of an exemplary embodiment of a light emitting diode display device.
Figure 14:
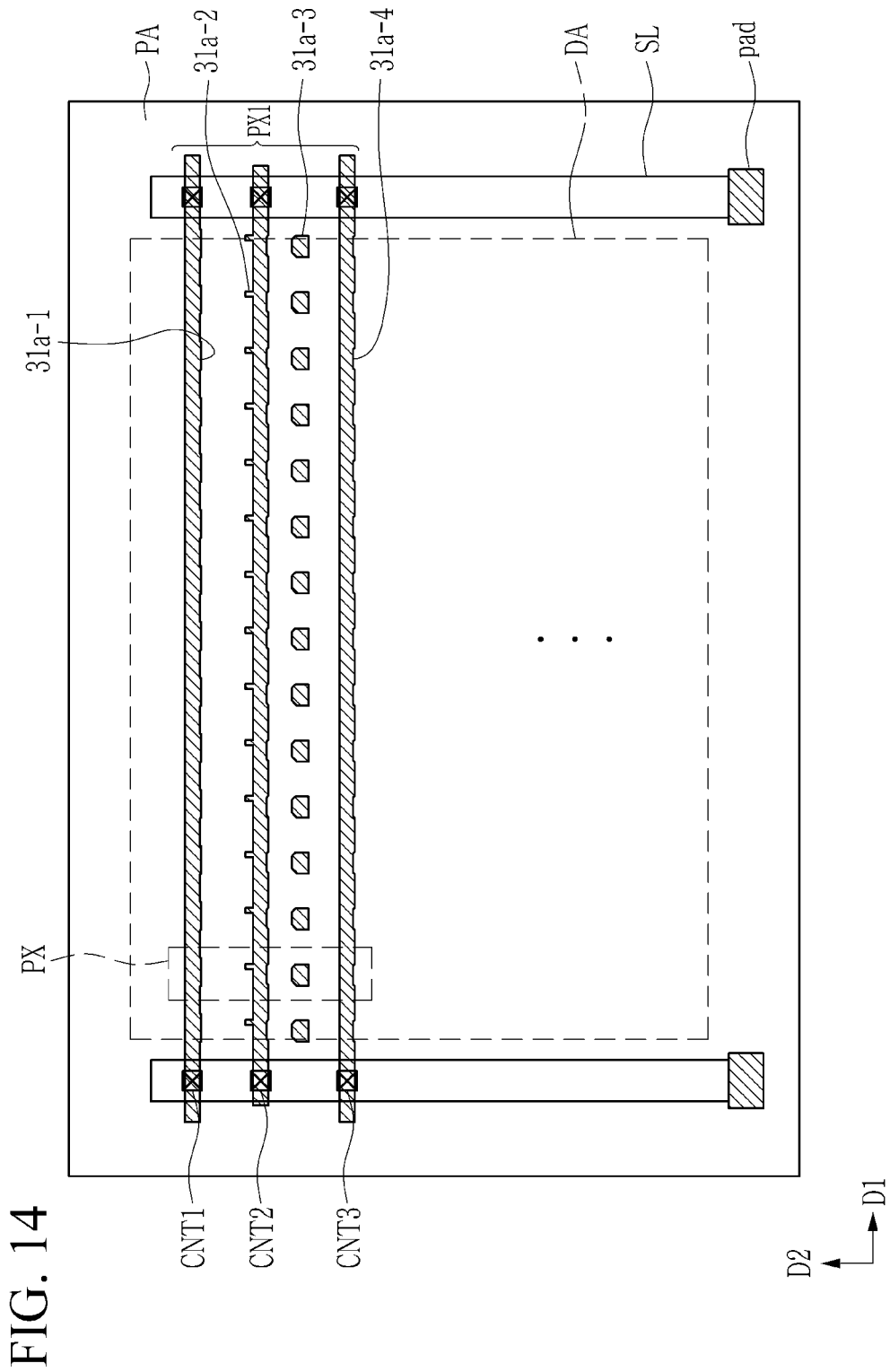
FIG. 14 illustrates a schematic plan view of an exemplary embodiment of a light emitting diode display device.
Figure 15:
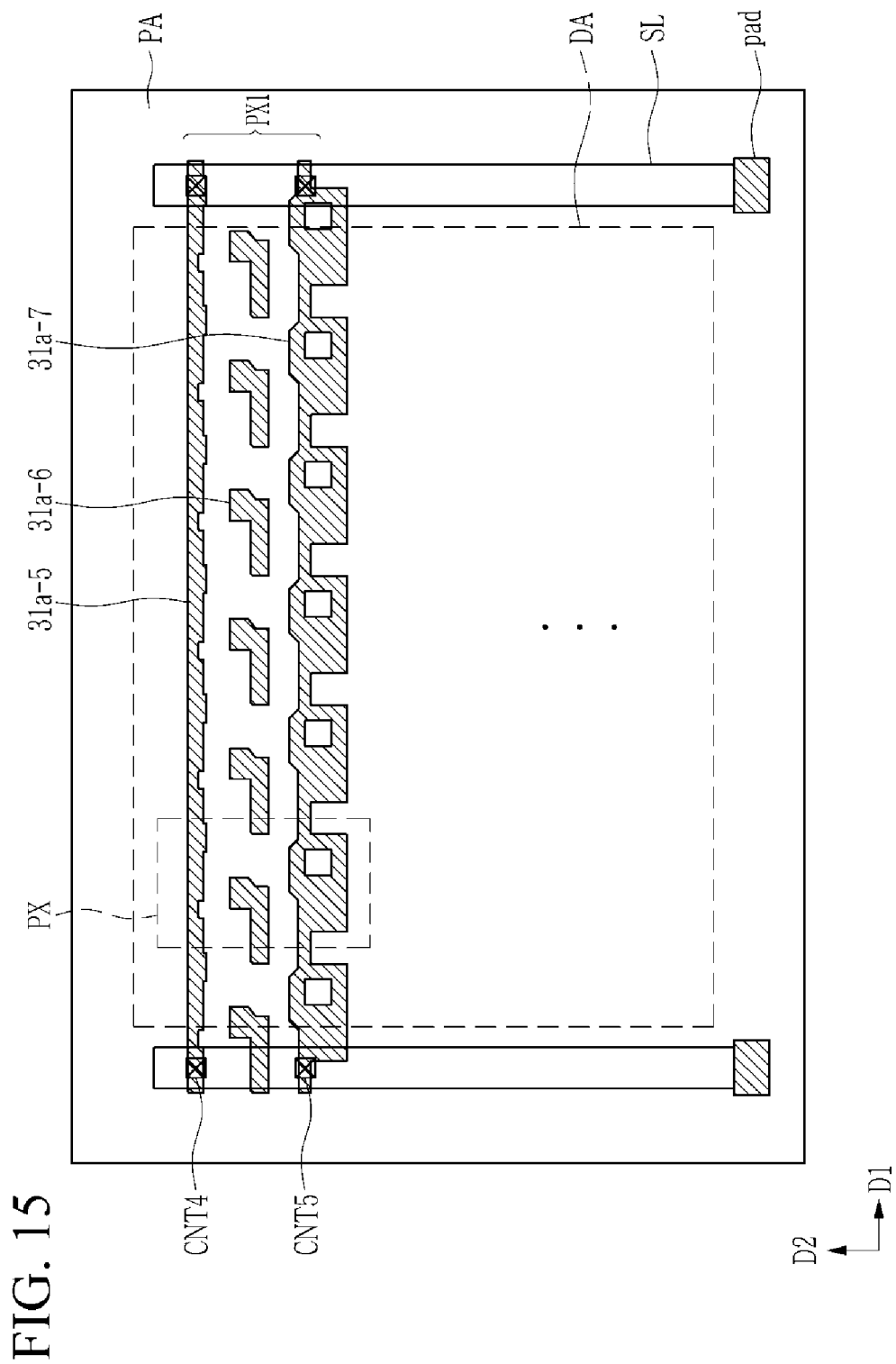
FIG. 15 illustrates a schematic plan view of an exemplary embodiment of a light emitting diode display device.

Hereinafter, an exemplary embodiment of a light emitting diode display device will be described with reference to FIGS. 13 to 15. FIGS. 13, 14, and 15 illustrate a schematic plan view of an exemplary embodiment of a light emitting diode display device, respectively. A description of the same or similar constituent elements as those of the exemplary embodiments described above will be omitted.

Referring to FIG. 13, the substrate 110 includes a display area DA including a light emitting diode and a peripheral area PA surrounding the display area DA. In the exemplary embodiment, the first region 31a disposed in the display area DA may extend in the first direction D1 to be disposed in the peripheral area PA.

The first region 31a disposed in the peripheral area PA may be connected to a signal line SL disposed in the same layer or another layer and connected through the contact hole. The signal line SL is disposed in the peripheral area PA and may connect the ends of the first region 31a to each other.

The signal line SL may be connected to a pad and connected to a power source or a ground. A predetermined voltage may be applied to the first region 31a through the signal line SL. In the specification, a configuration in which the pad is disposed in a region parallel to a long side of the display device is illustrated, but the invention is not limited thereto, and the pad may be disposed in a region parallel to a short side of the display device.

In an exemplary embodiment, the first region 31a may receive the driving voltage ELVDD, but is not limited thereto, and the first region 31a may receive the common voltage ELVSS, the data voltage, the gate voltage, or another constant voltage, for example.

The threshold voltage Vth (refer to FIG. 1) of the channel of the transistor which overlaps the first region 31a may be shifted according to a voltage applied to the first region 31a. When the applied voltage is the driving voltage ELVDD and when the applied voltage is the initialization voltage Vint, the threshold voltage Vth of the transistor may be shifted in the opposite direction. Therefore, it is possible to compensate the transistor by applying various voltages to the first region 31a in accordance with the characteristics of the transistor to be compensated by such a characteristic. In addition, the voltage applied to the first region 31a may be determined in consideration of whether the channel of the transistor is a p-type or n-type.

Specifically, referring to FIG. 14, the first sub-region 31a-1 overlapping the second scan line may extend along the first direction D1, and may extend to the peripheral area PA disposed outside the display area DA. In this case, the first sub-region 31a-1 disposed in the peripheral area PA may be connected to a predetermined signal line SL through a first contact hole CNT1.

The signal line SL may apply the constant voltage as described with reference to FIG. 13, and for example, it may apply the driving voltage ELVDD, but it is not limited thereto, and various voltages such as the gate voltage, the data voltage, and the common voltage may be applied. In the specification, the first sub-region 31a-1 is connected to the signal line SL at both ends thereof, but the invention is not limited thereto, and the first sub-region 31a-1 may be connected to the signal line SL only at either end thereof.

The second sub-region 31a-2 overlapping the first scan line 151 may extend along the first direction D1, and may extend to the peripheral area PA disposed outside the display area DA. In this case, the second sub-region 31a-2 disposed in the peripheral area PA may be connected to the signal line SL for applying a predetermined voltage through a second contact hole CNT2.

The fourth sub-region 31a-4 overlapping the light emitting control line may extend along the first direction D1, and may extend to the peripheral area PA disposed outside the display area DA. In this case, the fourth sub-region 31a-4 disposed in the peripheral area PA may be connected to the signal line SL for applying a predetermined voltage through a third contact hole CNT3.

In addition, the third sub-region 31a-3 overlapping the first gate electrode may have an island shape. The plurality of third sub-regions 31a-3 may not be connected to each other and may not extend to the peripheral area PA. The plurality of third sub-regions 31a-3 may not be directly supplied with a separate voltage.

The plurality of pixels PX may be repeatedly disposed along the first direction D1 and the second direction D2, and in the specification, although only one row PX1 in which the plurality of pixels PX are repeatedly disposed along the first direction D1 is shown, the plurality of pixels PX may be repeatedly disposed in the second direction D2.

Referring to FIG. 15, the fifth sub-region 31a-5 overlapping the initializing voltage line may extend along the first direction D1, and it may traverse the display area DA to extend to the peripheral area PA disposed outside the display area DA. In this case, the fifth sub-region 31a-5 disposed in the peripheral area PA may be connected to the signal line SL for applying a predetermined voltage through a fourth contact hole CNT4.

The seventh sub-region 31a-7 overlapping the storage line may extend along the first direction D1, and it may traverse the display area DA to extend to the peripheral area PA disposed outside the display area DA. In this case, the seventh sub-region 31a-7 disposed in the peripheral area PA may be connected to the signal line SL for applying a predetermined voltage through a fifth contact hole CNT5.

The sixth sub-region 31a-6 overlapping the parasitic capacitor control pattern may have an island shape. The plurality of sixth sub-regions 31a-6 may not be connected to each other and may not extend to the peripheral area PA. The sixth sub-region 31a-6 may not be directly supplied with a separate voltage.

Even in the exemplary embodiment of FIG. 15, the plurality of pixels PX may be repeatedly disposed along the first direction D1 and the second direction D2, and in the specification, although only one row PX1 in which the plurality of pixels PX are repeatedly disposed along the first direction D1 is shown, the plurality of pixels PX may be repeatedly disposed in the second direction D2.

Hereinafter, an exemplary embodiment of a manufacturing method of the light emitting diode display device will be described with reference to FIGS. 16 to 21. FIGS. 16, 17, 18, 19, 20, and 21 illustrate a cross-sectional view of a light emitting diode display device according to a manufacturing process, respectively. A description of the same or similar constituent elements as those of the exemplary embodiments described above will be omitted.

Figure 16:
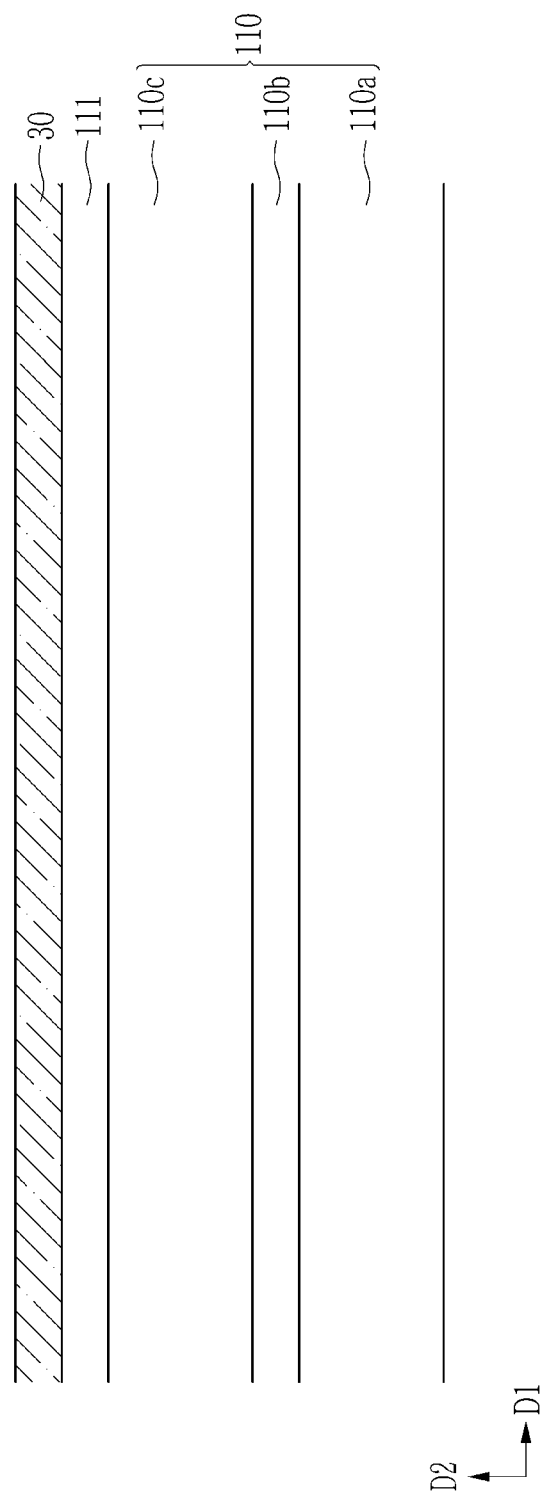

Referring to FIG. 16, the adhesive layer 111 is disposed on the substrate 110, and an amorphous silicon layer 30 is disposed on the adhesive layer 111. The amorphous silicon layer 30 may overlap the front surface of the substrate 110.

The substrate 110 may include plastic layers 110a and 110c and a barrier layer 110b. The plastic layers 110a and 110c and the barrier layer 110b may be alternately stacked.

Figure 17:
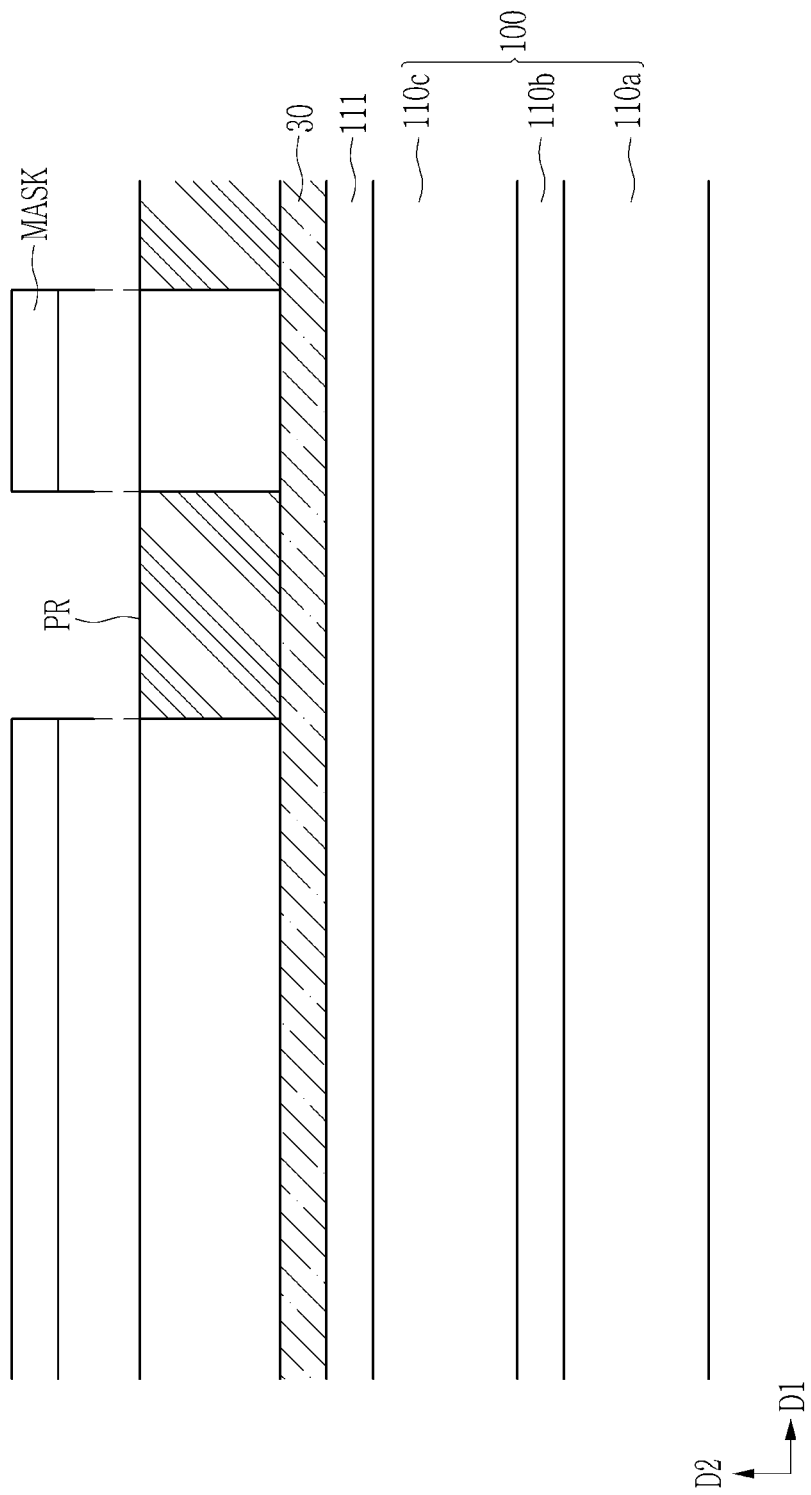

Then, as shown in FIG. 17, a photosensitive resin composition PR is applied on the amorphous silicon layer 30, and the photosensitive resin composition PR is exposed using a mask MASK for the gate conductor. In this case, the photosensitive resin composition PR may be a negative photosensitive resin composition.

Figure 18:
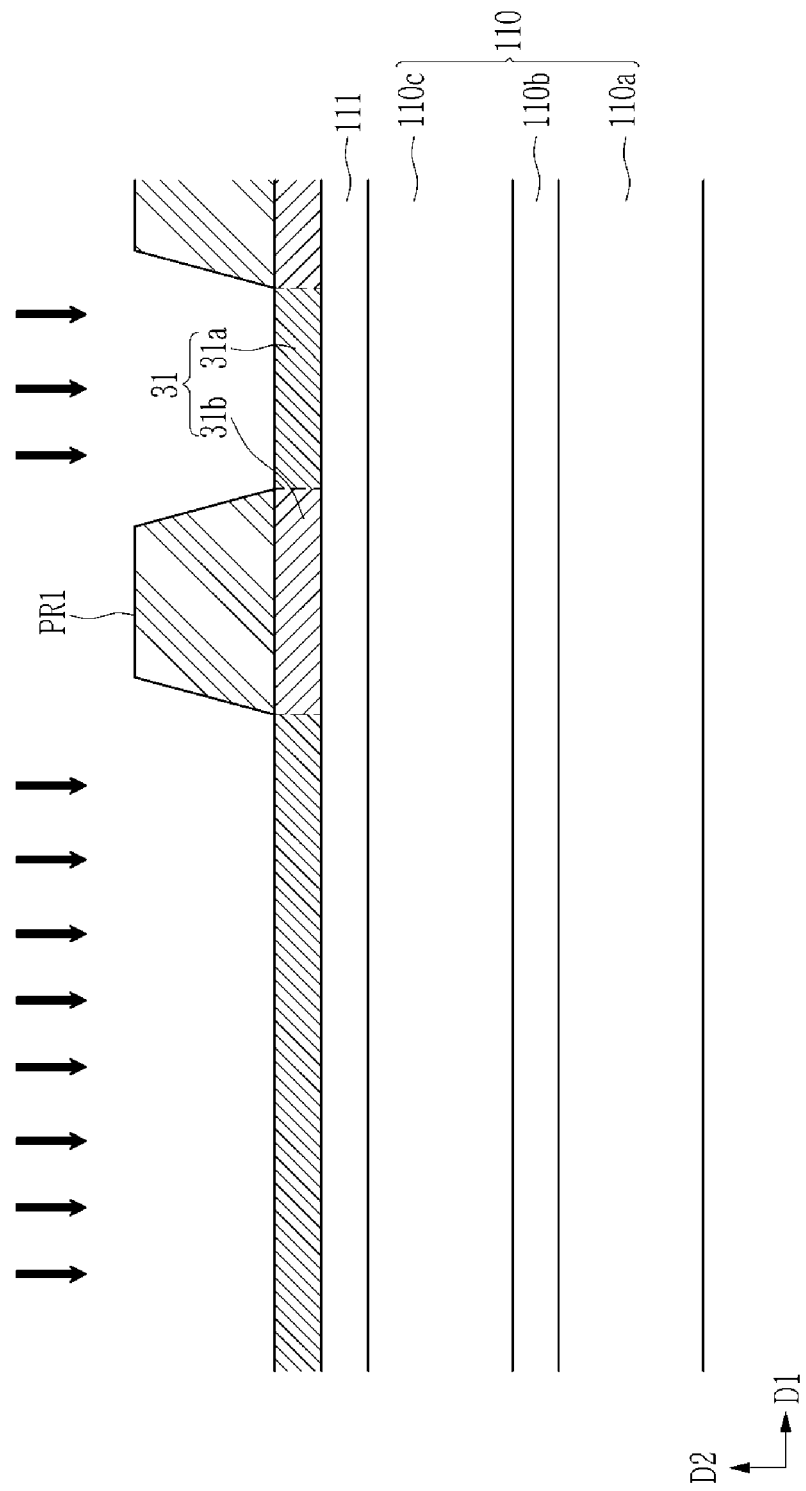

Then, as shown in FIG. 18, a patterned photosensitive resin layer PR1 is provided. The patterned photosensitive resin layer PR1 may be provided by developing the exposed photosensitive resin composition PR. In FIG. 17, the photosensitive resin composition disposed in a region not overlapping the mask MASK is cured to form the patterned photosensitive resin layer PR1 of FIG. 18.

Then, the first layer 31 including the first region 31a and the second region 31b is provided using the patterned photosensitive resin layer PR1 as a mask. The first region 31a may be a region not overlapping the photosensitive resin layer PR1 and that is doped with impurities. The second region 31b overlaps the photosensitive resin layer PR1, and includes amorphous silicon that is not doped with impurities.

Thereafter, the photosensitive resin layer PR1 is removed.

Figure 19:
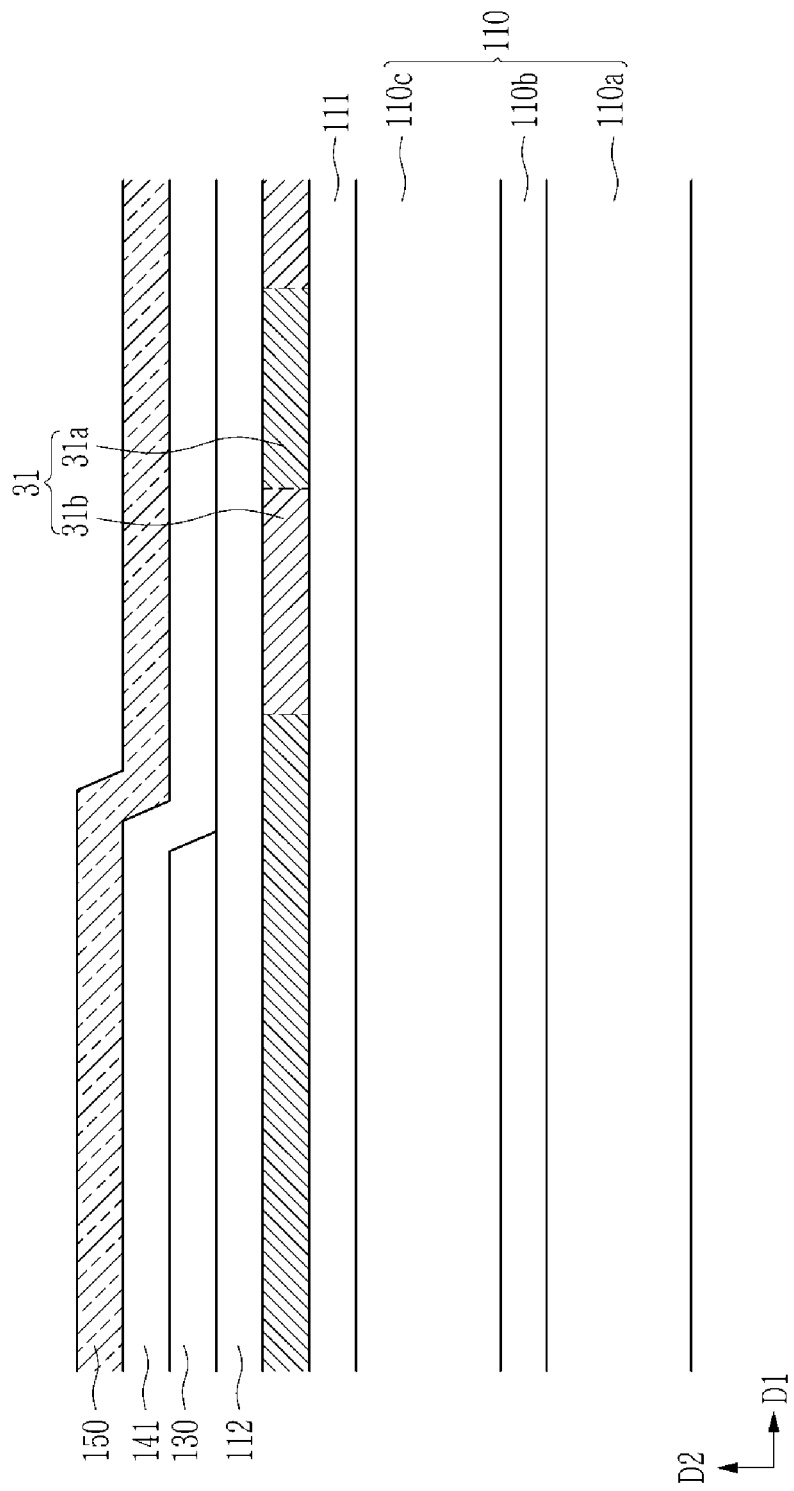

Then, as shown in FIG. 19, the buffer layer 112, the semiconductor layer 130, and the first gate insulating film 141 are sequentially disposed on the first layer 31. In addition, a first metal layer 150 is stacked on the first gate insulating film 141. The first metal layer 150 is a layer for forming the first gate conductor, and may overlap the front surface of the substrate 110.

Then, as shown in FIG. 20, a second photosensitive resin pattern PR2 is disposed on the first metal layer 150 by the mask MASK used in FIG. 17.

The second photosensitive resin pattern PR2 may be provided by applying a photosensitive resin composition and exposing and developing it using the mask MASK. In this case, the photosensitive resin composition may be a positive photosensitive resin composition, and the portion thereof that is exposed by the mask MASK may be removed.

Then, the exposed first metal layer 150 may be etched using the second photosensitive resin pattern PR2 to form the first gate conductors 153 and 155 as shown in FIG. 21. In the exemplary embodiment, the masks used in the process of forming the first gate conductor and the first region may be the same mask. The process may be simplified, and the process cost may be reduced.

Then, the remaining components are stacked to be able to provide the light emitting diode display device in the exemplary embodiment.

In the exemplary embodiment, the mask used in the process of forming the first gate conductor or the second gate conductor may be utilized to form the first layer including the first region and the second region. Therefore, the number of masks used in the manufacturing process is not increased, and thus the process may be simplified. In addition, it is possible to provide the first region in which the impurities are not doped in the region overlapping the front surface of the substrate and impurities are doped only in a region where the partially blocking is desired. By including such a first layer, it is possible to provide a transistor having excellent performance and a light emitting diode display device having an afterimage improvement effect.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A light emitting diode display device comprising:
a substrate;
a first layer disposed on the substrate;
a first transistor disposed on the first layer and including a first gate electrode; and
a light emitting diode electrically connected to the first transistor,
wherein the first layer overlaps the first gate electrode, and includes a first region including a first material and a second region including a second material different from the first material,
the first material includes amorphous silicon doped with impurities, and the second material includes amorphous silicon.

2. The light emitting diode display device of claim 1, wherein
the first region has conductivity.

3. The light emitting diode display device of claim 1, further comprising
a first gate conductor disposed on the first layer,
wherein the first gate conductor includes a first scan line, a second scan line, a light emitting control line, and the first gate electrode.

4. The light emitting diode display device of claim 3, wherein
the first region has substantially a same shape as that of the first gate conductor in a plan view.

5. The light emitting diode display device of claim 3, wherein
the first region includes at least one of
a first sub-region overlapping the second scan line,
a second sub-region overlapping the first scan line,
a third sub-region overlapping the first gate electrode, and
a fourth sub-region overlapping the light emitting control line.

6. The light emitting diode display device of claim 5, wherein
the first sub-region, the second sub-region, and the fourth sub-region extend along a first direction.

7. The light emitting diode display device of claim 1, wherein
the light emitting diode display includes a second gate conductor disposed on the first layer, and
the second gate conductor includes a parasitic capacitor control pattern, a storage line, and an initializing voltage line.

8. The light emitting diode display device of claim 7, wherein
the first region has substantially a same planar shape as that of the second gate conductor.

9. The light emitting diode display device of claim 7, wherein
the first region includes at least one of
a first sub-region overlapping the initializing voltage line,
a second sub-region overlapping the parasitic capacitor control pattern, and
a third sub-region overlapping the storage line.

10. The light emitting diode display device of claim 9, wherein
the first sub-region and the third sub-region extend along the first direction.

11. The light emitting diode display device of claim 1, wherein
the first region overlaps the first transistor.

12. The light emitting diode display device of claim 1, wherein
the first region receives a constant voltage.

13. The light emitting diode display device of claim 1, wherein
a driving voltage is applied to the first region.

14. The light emitting diode display device of claim 1, wherein
a thickness of the first region is reduced toward an end of the first region.

15. The light emitting diode display device of claim 1, wherein
a thickness of the first region is smaller than a thickness of the first layer.

16. The light emitting diode display device of claim 1, wherein
a thickness of the first region is equal to a thickness of the first layer.

17. A light emitting diode display device comprising:
a substrate;
a first layer disposed on the substrate;
a first transistor disposed on the first layer, and
a light emitting diode electrically connected to the first transistor,
wherein the first layer includes a first region overlapping the first transistor and having conductivity, and a second region including a semiconductor material, and
wherein the first layer overlaps an entirety of the display area of the substrate.

18. The light emitting diode display device of claim 17, wherein
the substrate includes a display area in which the light emitting diode is disposed and a peripheral area surrounding the display area, and
the first region receives a predetermined voltage from the peripheral area.

19. The light emitting diode display device of claim 17, further comprising
a first gate conductor disposed on the first layer,
wherein the first gate conductor includes a first scan line, a second scan line, a light emitting control line, and a first gate electrode, and
the first region overlaps the first gate conductor.

20. The light emitting diode display device of claim 18, further comprising a second gate conductor disposed on the first layer,
wherein the second gate conductor includes a parasitic capacitor control pattern, a storage line, and an initializing voltage line, and
the first region overlaps the second gate conductor.

* * * * *